United States Patent
Okutani et al.

(10) Patent No.: US 10,760,852 B2
(45) Date of Patent: Sep. 1, 2020

(54) SUBSTRATE DRYING METHOD AND SUBSTRATE PROCESSING APPARATUS

(71) Applicant: SCREEN Holdings Co., Ltd., Kyoto (JP)

(72) Inventors: Manabu Okutani, Kyoto (JP); Noriyuki Kikumoto, Kyoto (JP); Naohiko Yoshihara, Kyoto (JP); Hiroshi Abe, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 3 days.

(21) Appl. No.: 16/047,633

(22) Filed: Jul. 27, 2018

(65) Prior Publication Data

US 2019/0063834 A1 Feb. 28, 2019

(30) Foreign Application Priority Data

Aug. 31, 2017 (JP) .................. 2017-167867

(51) Int. Cl.
*H01L 21/67* (2006.01)
*F26B 5/10* (2006.01)
(Continued)

(52) U.S. Cl.
CPC .................. *F26B 5/10* (2013.01); *B08B 3/08* (2013.01); *H01L 21/02052* (2013.01);
(Continued)

(58) Field of Classification Search
CPC .... B08B 3/04; B08B 3/08; B08B 3/10; H01L 21/02041; H01L 21/02057;
(Continued)

(56) References Cited

U.S. PATENT DOCUMENTS 5,975,097 A * 11/1999 Yonemizu ......... H01L 21/67051
134/95.2
2007/0240743 A1* 10/2007 Hiroe ................ H01L 21/67017
134/94.1
(Continued)

FOREIGN PATENT DOCUMENTS

JP  2010-199261 A    9/2010
JP    2015050414   *  3/2015
(Continued)

OTHER PUBLICATIONS

Joan Tomsic, Dictionary of Materials and Testing (SAE Int'l 2000). (Year: 2000).*
(Continued)

*Primary Examiner* — Mikhail Kornakov
*Assistant Examiner* — Richard Z. Zhang
(74) *Attorney, Agent, or Firm* — Ostrolenk Faber LLP

(57) ABSTRACT

A substrate drying method for drying a front surface of a substrate having a pattern includes a sublimation-agent-liquid-film placing step of placing a liquid film of a liquid sublimation-agent on the front surface of the substrate, a high vapor-pressure liquid placing step of placing a liquid film of a high vapor-pressure liquid that has vapor pressure higher than the sublimation agent and that does not include water on the liquid film of the sublimation-agent placed on the front surface of the substrate, a vaporizing/cooling step of losing vaporization heat in response to vaporization of the high vapor-pressure liquid, and, cooling the sublimation-agent, and, as a result, solidifying the liquid film of the sublimation-agent, and, forming a sublimation-agent film on the front surface of the substrate, and a sublimating step of sublimating the sublimation-agent film.

7 Claims, 10 Drawing Sheets

(51) Int. Cl.
*B08B 3/08* (2006.01)
*H01L 21/02* (2006.01)

(52) U.S. Cl.
CPC .. *H01L 21/02057* (2013.01); *H01L 21/67028* (2013.01); *H01L 21/67034* (2013.01)

(58) Field of Classification Search
CPC ......... H01L 21/02052; H01L 21/02054; H01L 21/67; H01L 21/67017; H01L 21/67028; H01L 21/67034; F26B 5/04; F26B 5/06; F26B 5/065; F26B 5/08; F26B 5/10
See application file for complete search history.

(56) References Cited

U.S. PATENT DOCUMENTS

| | | | | |
|---|---|---|---|---|
| 2008/0127508 A1* | 6/2008 | Ohno | ................ | H01L 21/02052 34/552 |
| 2010/0055924 A1* | 3/2010 | Ganesan | ........... | H01L 21/02087 438/748 |
| 2012/0175819 A1* | 7/2012 | Miya | ................ | H01L 21/02052 264/334 |
| 2012/0304483 A1* | 12/2012 | Sirard | ............... | H01L 21/02057 34/289 |
| 2013/0167877 A1* | 7/2013 | Fujiwara | .................. | B08B 3/04 134/26 |
| 2013/0284209 A1 | 10/2013 | Kim et al. | ....... | 134/91 |
| 2016/0214148 A1 | 7/2016 | Okutani et al. | | |
| 2017/0178892 A1* | 6/2017 | Sato | ................. | H01L 21/02057 |
| 2017/0236703 A1 | 8/2017 | Higuchi et al. | | |

FOREIGN PATENT DOCUMENTS

| | | | |
|---|---|---|---|
| JP | 2015142069 | * | 8/2015 |
| JP | 2017-050575 A | | 3/2017 |
| JP | 2017-147273 A | | 8/2017 |
| KR | 10-2012-0004451 A | | 1/2012 |
| KR | 10-2015-0039189 A | | 4/2015 |
| WO | WO 2010/120654 A1 | | 10/2010 |

OTHER PUBLICATIONS

C. Bevan, Monohydric Alcohols: C1 to C6, Patty's Toxicology (John Wiley & Sons 2012). (Year: 2012).*

Y. Tanaka et al., Viscosity of (Water+Alcohol) Mixtures Under High Pressure, Int'l J. Thermophysics 8:2 (1987). (Year: 1987).*

* cited by examiner

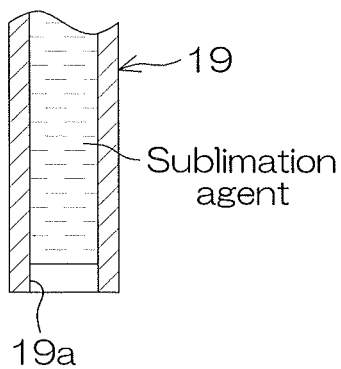
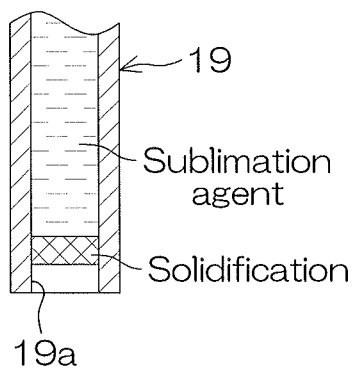
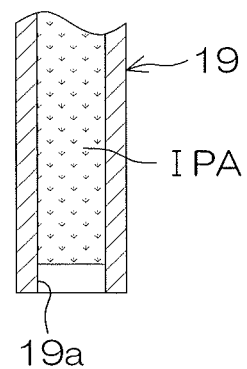
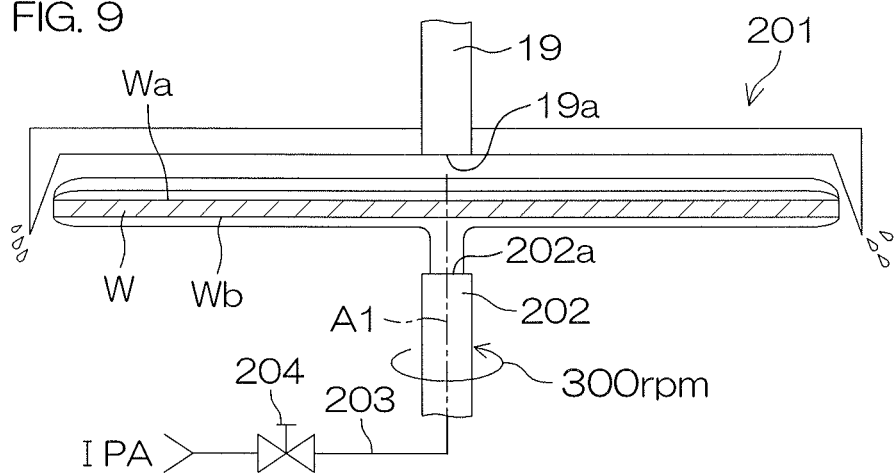
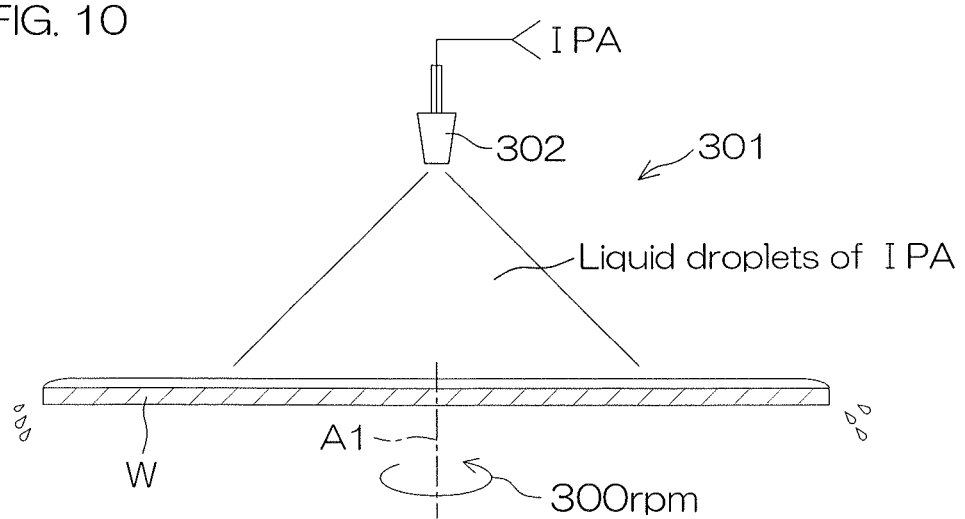

SUBSTRATE DRYING METHOD AND SUBSTRATE PROCESSING APPARATUS

BACKGROUND OF THE INVENTION

1. Field of the Invention

The present invention relates to a substrate drying method and a substrate processing apparatus. Examples of substrates to be processed include semiconductor wafers, substrates for liquid crystal displays, substrates for FPDs (Flat Panel Displays) such as organic EL (electroluminescence) displays, substrates for optical disks, substrates for magnetic disks, substrates for magneto-optical disks, substrates for photomasks, ceramic substrates, and substrates for solar cells.

2. Description of the Related Art

In a manufacturing process of a semiconductor device, a front surface of a substrate, such as a semiconductor wafer, is processed with a processing liquid. A single-substrate processing type apparatus that processes substrates one by one includes a spin chuck that rotates a substrate while holding the substrate substantially horizontally and a nozzle that supplies a processing liquid to a front surface of the substrate being rotated by the spin chuck.

In a typical substrate processing step, a chemical liquid is supplied to a substrate held by the spin chuck. Thereafter, a rinse liquid is supplied to the substrate, and, as a result, the chemical liquid on the substrate is replaced by the rinse liquid. Thereafter, a spin dry step is performed to exclude the rinse liquid on the substrate. In the spin dry step, the substrate is rotated at a high speed, and, as a result, the rinse liquid adhering to the substrate is shaken off and is removed (dried). A generally-used rinse liquid is deionized water.

A sublimation drying technique disclosed by Japanese Patent Application Publication No. 2010-199261 has been proposed in order to restrain or prevent the occurrence of a pattern collapse in the spin dry step. In Japanese Patent Application Publication No. 2010-199261, a frozen film is formed on a front surface of a substrate by supplying an ultra-low-temperature nitrogen gas (about −60° C.) to the front surface of the substrate. An aqueous component included in the frozen film of the front surface of the substrate is sublimated by continuing to supply the ultra-low-temperature nitrogen gas after the formation of the frozen film, and, as a result, the front surface of the substrate is dried without generating a liquid phase on the front surface of the substrate.

SUMMARY OF THE INVENTION

In the technique of Japanese Patent Application Publication No. 2010-199261, an ultra-low-temperature nitrogen gas (about −60° C.) is required to be continuously supplied to the substrate, and therefore equipment for supplying the nitrogen gas is needed, and there is a fear that running costs will become enormous.

The present inventors have considered that a solvent that has a sublimation capability and a low freezing point (as an example, a fluorine-based organic solvent that has a ring structure (freezing point of about 20.5° C.), tertiary butyl alcohol (freezing point of about 25° C.), or the like) is used as a sublimation agent, and have considered that a sublimation agent that is any one of these liquid sublimation agents is supplied to the front surface of the substrate, and have considered that a liquid having a temperature lower than the freezing point of the sublimation agent is supplied to a rear surface of the substrate as a temperature-controlling fluid for solidifying (freezing) a solvent of a sublimation agent. In detail, the present inventors supply cold water that has a liquid temperature of about 5° C. to about 15° C. to the rear surface of the substrate as a temperature-controlling liquid. Thereafter, a sublimation agent is cooled by supplying the cold water to the rear surface of the substrate, and, as a result, the sublimation agent, such as a fluorine-based organic solvent having a ring structure or tertiary butyl alcohol, is solidified, and a sublimation-agent film is formed on the front surface of the substrate. Thereafter, the front surface of the substrate is dried by sublimating the sublimation-agent film.

However, in this technique, there is a fear that a water mist that has occurred in the rear surface of the substrate will flow around toward the front-surface side of the substrate, and water will mix with the sublimation-agent film that has been solidified. If water has mixed with the sublimation-agent film, there is a fear that the sublimation of the sublimation agent will be obstructed. Not only that, there is another fear that the pattern collapse will be promoted by the fact that water is liquefied in the surface of the substrate. Therefore, a solid sublimation-agent film has been desired to be excellently formed while preventing contamination of water into the solid sublimation-agent film.

Therefore, it is an object of the present invention to provide a substrate drying method and a substrate processing apparatus both of which are capable of excellently forming a solid sublimation-agent film while preventing contamination of water into the solid sublimation-agent film and hence capable of excellently realizing sublimation drying.

The present invention provides a substrate drying method for drying a front surface of a substrate having a pattern, and the substrate drying method includes a sublimation-agent-liquid-film placing step of placing a liquid film of a liquid sublimation agent on the front surface of the substrate, a high vapor-pressure liquid placing step of placing a liquid film of a high vapor-pressure liquid that has vapor pressure higher than the sublimation agent and that does not include water on the liquid film of the sublimation agent placed on the front surface of the substrate, a vaporizing/cooling step of losing vaporization heat in response to vaporization of the high vapor-pressure liquid, and, cooling the sublimation agent, and, as a result, solidifying the liquid film of the sublimation agent, and, forming a sublimation-agent film on the front surface of the substrate, and a sublimating step of sublimating the sublimation-agent film.

According to this method, a liquid film of a sublimation agent is placed on the front surface of the substrate. Also, a liquid film of a high vapor-pressure liquid that has vapor pressure higher than the sublimation agent and that does not include water is placed on the liquid film of the sublimation agent. After the liquid film of the high vapor-pressure liquid is placed thereon (i.e., after the supply of the high vapor-pressure liquid is stopped), vaporization heat is lost in response to vaporization of the high vapor-pressure liquid, and, as a result, a sublimation agent included in the liquid film of the sublimation agent is cooled, and, as a result, the liquid film of the sublimation agent is solidified. Whereby, it is possible to excellently form a sublimation-agent film while preventing contamination of water into the solid sublimation-agent film.

Also, in the sublimating step, sublimating heat is lost in response to the sublimation of the sublimation-agent film, and the sublimation-agent film is kept at or below a freezing point (melting point). Therefore, it is possible to prevent the sublimation-agent film from being melted. Whereby, it is possible to excellently realize sublimation drying.

In one preferred embodiment of the present invention, a high vapor-pressure liquid included in the liquid film of the high vapor-pressure liquid has a liquid temperature higher than a freezing point of a sublimation agent included in the liquid film of the sublimation agent.

According to this method, it is possible to use a high vapor-pressure liquid at a comparatively high liquid temperature. It is also possible to use the high vapor-pressure liquid at a room temperature depending on the kind of the high vapor-pressure liquid (for example, in a case in which a fluorine-based organic solvent whose freezing point is about 20.5° C. and that has a ring structure is employed as a sublimation agent). In this case, it is also possible to disuse a temperature control unit for high vapor-pressure liquids, and hence possible to reduce costs.

In one preferred embodiment of the present invention, a high vapor-pressure liquid included in the liquid film of the high vapor-pressure liquid has specific gravity smaller than a sublimation agent included in the liquid film of the sublimation agent, and the high vapor-pressure liquid placing step includes a continuously-flowing supply step of supplying a high vapor-pressure liquid in a continuously-flowing state from above toward the liquid film of the sublimation agent placed on the front surface of the substrate. The liquid film of the high vapor-pressure liquid may be formed by a difference in specific gravity with respect to the sublimation agent.

According to this method, a high vapor-pressure liquid is supplied in a continuously-flowing state from above toward the liquid film of the sublimation agent. In this case, there is a fear that the high vapor-pressure liquid will mix with the liquid film of the sublimation agent.

However, the high vapor-pressure liquid has specific gravity smaller than the sublimation agent, and therefore it is possible to excellently form a liquid film of a high vapor-pressure liquid on the liquid film of the sublimation agent by a difference in specific gravity between the high vapor-pressure liquid and the sublimation agent.

In one preferred embodiment of the present invention, the sublimation-agent-liquid-film placing step includes a high vapor-pressure liquid spray step of spraying liquid droplets of a high vapor-pressure liquid from above toward the liquid film of the sublimation agent placed on the front surface of the substrate.

According to this method, liquid droplets of a high vapor-pressure liquid are sprayed onto the front surface of the substrate, and therefore it is possible to evenly supply the sublimation agent to a wide area of the front surface of the substrate. Whereby, it is possible to excellently place a liquid film of a high vapor-pressure liquid on the liquid film of the sublimation-agent.

In one preferred embodiment of the present invention, the high vapor-pressure liquid placing step includes a step of supplying a high vapor-pressure liquid from a nozzle that is used also as a nozzle that supplies a sublimation agent in the sublimation-agent-liquid-film placing step.

According to this method, a high vapor-pressure liquid is supplied from a nozzle that is used also as a nozzle that supplies a sublimation agent. After the supply of a sublimation agent from the nozzle is ended, there is a fear that a sublimation agent adhering to the discharge port of the nozzle will vaporize, and, accordingly, a pipe wall near the discharge port of the nozzle will be cooled. If a sublimation agent remains inside the nozzle, there is a fear that a sublimation agent that exists near the discharge port of the nozzle will be solidified.

However, in the high vapor-pressure liquid placing step that is performed subsequently to the sublimation-agent-liquid-film placing step, a high vapor-pressure liquid is discharged from the same nozzle, and, as a result, the liquid inside the nozzle is replaced with the high vapor-pressure liquid from the sublimation agent. The high vapor-pressure liquid existing near the discharge port of the nozzle is not solidified by cooling the pipe wall near the discharge port of the nozzle.

Consequently, a unit that prevents a sublimation agent from being solidified is not required to be provided at the nozzle. Whereby, it is possible to reduce costs.

In one preferred embodiment of the present invention, the high vapor-pressure liquid placing step includes a step of supplying a high vapor-pressure liquid from a high vapor-pressure liquid nozzle different from a sublimation-agent nozzle that supplies a sublimation agent in the sublimation-agent-liquid-film placing step, and the substrate drying method further includes a sublimation agent-nozzle heating step of heating the sublimation-agent-nozzle after a sublimation agent is supplied from the sublimation-agent-nozzle.

According to this method, a sublimation agent is supplied from the sublimation-agent-nozzle in the sublimation-agent-liquid-film placing step. A high vapor-pressure liquid is supplied from the high vapor-pressure liquid nozzle in the high vapor-pressure liquid placing step. After a sublimation-agent is supplied from the sublimation-agent-nozzle, the sublimation-agent-nozzle is heated. Whereby, it is possible to prevent the sublimation gent from being solidified.

In one preferred embodiment of the present invention, the substrate drying method further includes a step of, prior to the vaporizing/cooling step, supplying a second high vapor-pressure liquid that has vapor pressure higher than the sublimation agent to a rear surface that is a surface on a side opposite to the front surface in the substrate, and then stopping supplying the second high vapor-pressure liquid.

According to this method, a second high vapor-pressure liquid is supplied to a rear surface of the substrate. Vaporization heat is lost in response to vaporization of the second high vapor-pressure liquid by stopping the supply of the second high vapor-pressure liquid. In other words, vaporization heat is lost from the sublimation agent not only by the high vapor-pressure liquid on the front surface side of the substrate but also by the second high vapor-pressure liquid on the rear surface side of the substrate, thus making it possible to cool the liquid film of the sublimation agent in a short time.

In one preferred embodiment of the present invention, the aforementioned method further includes a substrate rotating step of rotating the substrate around a predetermined rotational axis in parallel with at least either one of the sublimation-agent-liquid-film placing step and the vaporizing/cooling step and a high-speed rotation step of rotating the substrate around the predetermined rotational axis at a speed higher than in the substrate rotating step in parallel with the sublimating step.

According to this method, the substrate is rotated at a high speed in the sublimating step. The contact speed between the sublimation-agent film and its circumambient atmosphere is increased by the high-speed rotation of the substrate. Whereby, it is possible to advance the sublimation of the sublimation-agent film, and hence makes it possible to sublimate the sublimation-agent film in a short time.

The present invention provides a substrate processing apparatus including a substrate holding unit that holds a substrate whose front surface has a pattern, a rotation unit that rotates a substrate held by the substrate holding unit around a predetermined rotational axis, a sublimation-agent supply unit that supplies a liquid sublimation-agent to the front surface of the substrate, and a high vapor-pressure liquid supply unit that supplies a high vapor-pressure liquid that has vapor pressure higher than the sublimation agent and that does not include water to a rear surface that is a surface on a side opposite to the front surface in the substrate.

According to this arrangement, a sublimation agent is supplied to the front surface of the substrate. Consequently, a liquid film of the sublimation agent is formed on an upper surface of the substrate. Also, a liquid film of a high vapor-pressure liquid is placed on the liquid film of the sublimation agent by supplying the high vapor-pressure liquid that has vapor pressure higher than the sublimation agent and that does not include water onto the front surface of the substrate. After the liquid film of the high vapor-pressure liquid is placed (i.e., after the supply of the high vapor-pressure liquid is stopped), vaporization heat is lost in response to the vaporization of the high vapor-pressure liquid, and, as a result, the sublimation agent is cooled, and the liquid film of the sublimation agent is solidified. Whereby, it is possible to excellently form a sublimation-agent film while preventing contamination of water into the solid sublimation-agent film. Therefore, it is possible to excellently realize sublimation drying.

In one preferred embodiment of the present invention, a high vapor-pressure liquid supplied by the high vapor-pressure liquid supply unit has a liquid temperature higher than a freezing point of a sublimation agent supplied by the sublimation-agent supply unit.

According to this arrangement, it is possible to use a high vapor-pressure liquid at a comparatively high liquid temperature. It is also possible to use the high vapor-pressure liquid at a room temperature depending on the kind of the high vapor-pressure liquid (for example, in a case in which a fluorine-based organic solvent whose freezing point is about 20.5° C. and that has a ring structure is employed as a sublimation agent). In this case, it is also possible to disuse a temperature control unit for high vapor-pressure liquids, and hence possible to reduce costs.

In one preferred embodiment of the present invention, the substrate processing apparatus further includes a controller that controls the rotation unit, the sublimation-agent supply unit, and the high vapor-pressure liquid supply unit, and the controller executes a sublimation-agent-liquid-film placing step of placing a liquid film of a sublimation agent on the front surface of the substrate by means of the rotation unit and the sublimation-agent supply unit, a high vapor-pressure liquid placing step of placing a liquid film of a high vapor-pressure liquid on the liquid film of the sublimation agent placed on the front surface of the substrate by means of the high vapor-pressure liquid supply unit, a vaporizing/cooling step of losing vaporization heat in response to vaporization of the high vapor-pressure liquid, and, cooling the sublimation agent, and, as a result, solidifying the liquid film of the sublimation agent, and, forming a sublimation-agent film on the front surface of the substrate, and a sublimating step of sublimating the sublimation-agent film by means of the rotation unit.

According to this arrangement, a liquid film of a sublimation agent is placed on the front surface of the substrate. Also, a liquid film of a high vapor-pressure liquid that has vapor pressure higher than the sublimation agent and that does not include water is placed on the liquid film of the sublimation agent. After the liquid film of the high vapor-pressure liquid is placed thereon (i.e., after the supply of the high vapor-pressure liquid is stopped), vaporization heat is lost in response to vaporization of the high vapor-pressure liquid, and, as a result, a sublimation agent is cooled, and, as a result, the liquid film of the sublimation agent is solidified. Whereby, it is possible to excellently form a sublimation-agent film while preventing contamination of water into the solid sublimation-agent film.

Also, in the sublimating step, sublimating heat is lost in response to the sublimation of the sublimation-agent film, and the sublimation-agent film is kept at or below a freezing point (melting point). Therefore, it is possible to prevent the sublimation agent included in the sublimation-agent film from being melted. Whereby, it is possible to excellently realize sublimation drying.

In one preferred embodiment of the present invention, a high vapor-pressure liquid supplied by the high vapor-pressure liquid supply unit has specific gravity smaller than a sublimation agent supplied by the sublimation-agent supply unit, and the high vapor-pressure liquid supply unit includes a continuously-flowing supply unit that supplies a high vapor-pressure liquid in a continuously-flowing state, and the controller executes a continuously-flowing supply step of supplying a high vapor-pressure liquid in a continuously-flowing state from above toward the liquid film of the sublimation agent placed on the front surface of the substrate by means of the continuously-flowing supply unit in the high vapor-pressure liquid placing step, and a liquid film of the high vapor-pressure liquid is formed by a difference in specific gravity with respect to the sublimation agent.

According to this arrangement, a high vapor-pressure liquid is supplied in a continuously-flowing state from above toward the liquid film of the sublimation agent. In this case, there is a fear that the high vapor-pressure liquid will mix with the liquid film of the sublimation agent.

However, the high vapor-pressure liquid has specific gravity smaller than the sublimation agent, and therefore it is possible to excellently form a liquid film of a high vapor-pressure liquid on the liquid film of the sublimation agent by a difference in specific gravity between the high vapor-pressure liquid and the sublimation agent.

In one preferred embodiment of the present invention, the high vapor-pressure liquid supply unit includes a high vapor-pressure liquid spray unit that sprays liquid droplets of a high vapor-pressure liquid.

According to this arrangement, liquid droplets of a high vapor-pressure liquid are sprayed onto the front surface of the substrate, and therefore it is possible to evenly supply the sublimation agent to a wide area of the front surface of the substrate. Whereby, it is possible to excellently place a liquid film of a high vapor-pressure liquid on the liquid film of the sublimation agent.

In one preferred embodiment of the present invention, the sublimation-agent supply unit and the high vapor-pressure liquid supply unit include a unit that supplies a sublimation agent and a high vapor-pressure liquid toward the substrate from a nozzle shared between the sublimation-agent supply unit and the high vapor-pressure liquid supply unit.

According to this arrangement, a high vapor-pressure liquid is supplied from a nozzle that is used also as a nozzle that supplies a sublimation agent. After the supply of a sublimation agent from the nozzle is ended, there is a fear that a sublimation agent adhering to the discharge port of the nozzle will vaporize, and, accordingly, a pipe wall near the discharge port of the nozzle will be cooled. If a sublimation agent remains inside the nozzle, there is a fear that a sublimation agent that exists near the discharge port of the nozzle will be solidified.

However, in the high vapor-pressure liquid placing step that is performed subsequently to the sublimation-agent-liquid-film placing step, a high vapor-pressure liquid is discharged from the same nozzle, and, as a result, the liquid inside the nozzle is replaced with the high vapor-pressure liquid from the sublimation agent. The high vapor-pressure liquid existing near the discharge port of the nozzle is not solidified by cooling the pipe wall near the discharge port of the nozzle.

Consequently, a unit that prevents a sublimation agent from being solidified is not required to be provided at the nozzle. Whereby, it is possible to reduce costs.

In one preferred embodiment of the present invention, the sublimation-agent supply unit includes a sublimation-agent-nozzle that supplies a sublimation agent, and the high vapor-pressure liquid supply unit includes a high vapor-pressure liquid nozzle that supplies a high vapor-pressure liquid and that differs from the sublimation-agent-nozzle, and the substrate processing apparatus further includes a sublimation-agent-nozzle heating unit that heats the sublimation-agent-nozzle.

According to this arrangement, a sublimation agent is supplied from the sublimation-agent-nozzle in the sublimation-agent-liquid-film placing step. A high vapor-pressure liquid is supplied from the high vapor-pressure liquid nozzle in the high vapor-pressure liquid placing step. After a sublimation agent is supplied from the sublimation-agent-nozzle, the sublimation-agent-nozzle is heated. Whereby, it is possible to prevent the sublimation agent from being solidified.

The aforementioned or other objects, features, and effects of the present invention will be clarified by the following description of preferred embodiments given below with reference to the accompanying drawings.

BRIEF DESCRIPTION OF THE DRAWINGS

FIG. 8A to FIG. 8C are schematic views shown to describe effects according to the first preferred embodiment of the present invention.

FIG. 9 is a schematic view showing a state around a substrate when the sublimation drying step is performed in a second preferred embodiment of the present invention.

FIG. 10 is a schematic view showing a state around a substrate when the sublimation drying step is performed in a third preferred embodiment of the present invention.

DETAILED DESCRIPTION OF PREFERRED EMBODIMENTS

First Preferred Embodiment

Figure 1:
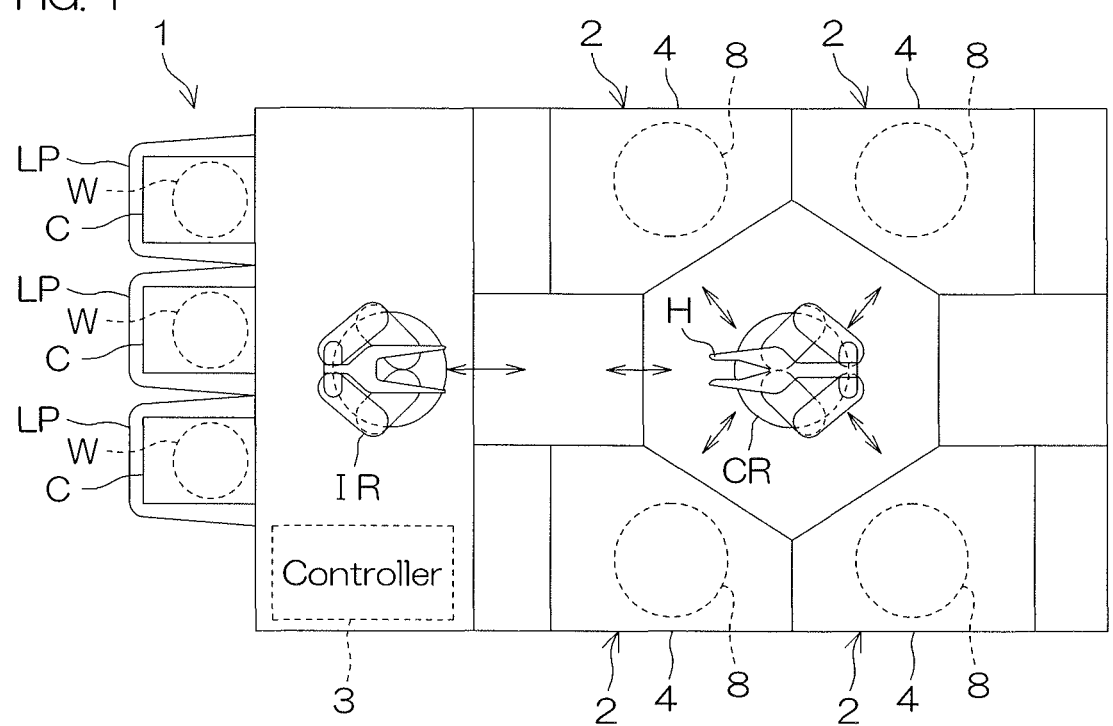
FIG. 1 is a schematic view of a substrate processing apparatus, which is seen from above, according to a first preferred embodiment of the present invention.

FIG. 1 is a schematic view of a substrate processing apparatus 1, which is seen from above, according to a first preferred embodiment of the present invention. The substrate processing apparatus 1 is a single-substrate processing type apparatus that processes substrates W, such as silicon wafers, one by one. In the present preferred embodiment, the substrate W is a disk-shaped substrate. The substrate processing apparatus 1 includes a plurality of processing units 2 each of which processes a substrate W by use of a processing liquid and a rinse liquid, a load port LP at which a substrate container C that contains each of a plurality of substrates W that are processed by the processing units 2 is placed, an indexer robot IR and a substrate transfer robot CR each of which transfers a substrate W between the load port LP and the processing unit 2, and a controller 3 that controls the substrate processing apparatus 1. The indexer robot IR transfers the substrate W between the substrate container C and the substrate transfer robot CR. The substrate transfer robot CR transfers the substrate W between the indexer robot IR and the processing unit 2. The plurality of processing units 2 are identical, for example, in configuration with each other.

Figure 2:
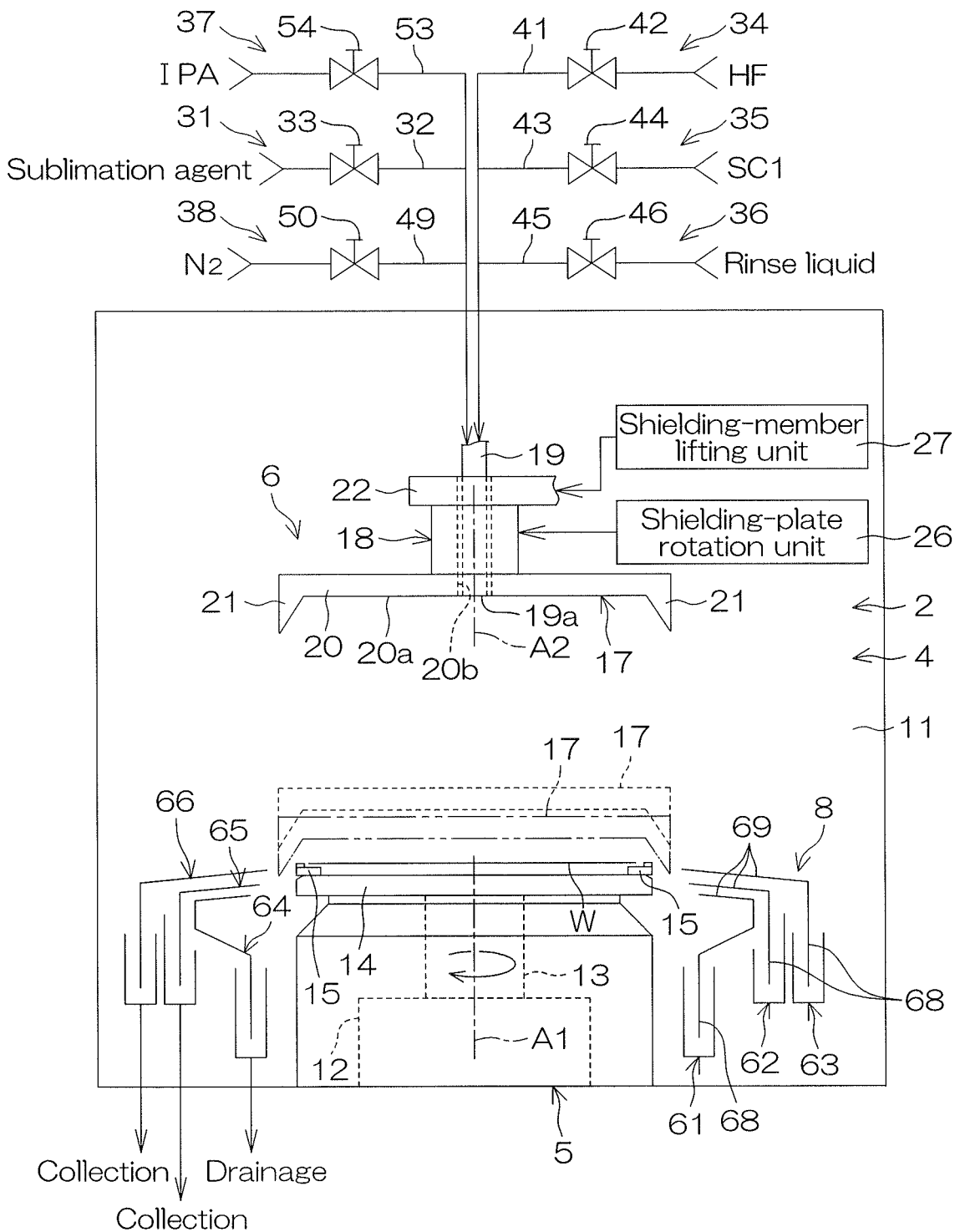
FIG. 2 is an illustrative cross-sectional view shown to describe an arrangement example of a processing unit included in the substrate processing apparatus.

FIG. 2 is an illustrative cross-sectional view shown to describe an arrangement example of the processing unit 2.

The processing unit 2 includes a box-shaped chamber 4, a spin chuck (substrate holding unit) 5 that rotates a substrate W around a vertical rotational axis A1 passing through the center of the substrate W while holding the single substrate W in a horizontal attitude in the chamber 4, a sublimation-agent supply unit that supplies a liquid sublimation agent to an upper surface of the substrate W (a front surface Wa of the substrate W (see FIG. 4 and the like)) held by the spin chuck 5, a high vapor-pressure liquid supply unit that supplies IPA (isopropyl alcohol), which is an example of a high vapor-pressure liquid that has vapor pressure higher than water (i.e., vapor pressure higher than the sublimation agent) and that does not include water, to a upper surface of the substrate W (the front surface Wa (see FIG. 4 and the like) of the substrate W) held by the spin chuck 5, a shielding member 6 that faces the upper surface of the substrate W held by the spin chuck 5 and that blocks a space existing above the substrate W from its circumambient atmosphere, and a cylindrical processing cup 8 that surrounds the lateral side of the spin chuck 5.

The chamber 4 includes a box-shaped partition wall 11 that contains the spin chuck 5, etc.

A clamping-type chuck that clamps the substrate W in a horizontal direction and that horizontally holds the substrate W is employed as the spin chuck 5. In detail, the spin chuck 5 includes a spin motor (rotation unit) 12, a lower spin shaft 13 that is integrally united with a driving shaft of the spin motor 12, and a disk-shaped spin base 14 that is substantially horizontally attached to an upper end of the lower spin shaft 13.

The spin base 14 includes a horizontal and circular upper surface 14a that has an outer diameter greater than that of the substrate W. A plurality of (three or more, e.g., six) clamping members 15 are disposed on the upper surface 14a at its peripheral edge. The clamping members 15 are spaced out with suitable intervals there between, e.g., are spaced out evenly on a circumference corresponding to the outer peripheral shape of the substrate W at the peripheral edge of the upper surface of the spin base 14.

The shielding member 6 includes a shielding plate 17, an upper spin shaft 18 that is disposed at the shielding plate 17 so as to be rotatable together with the shielding plate 17, and an upper-surface nozzle 19 that passes through a central part of the shielding plate 17 in an up-down direction. The shielding plate 17 includes a disk portion 20 that is horizontally disposed and a cylindrical portion 21 that is disposed along an outer peripheral edge of the disk portion 20. The disk portion 20 is formed in a disk shape whose diameter is substantially equal to or greater than that of the substrate W. The disk portion 20 has its lower surface having a circular substrate-facing surface 20a that faces the whole area of the upper surface of the substrate W. A cylindrical through hole 20b that upwardly and downwardly passes through the disk portion 20 is formed in a central part of the substrate-facing surface 20a. The through hole 20b is defined by a cylindrical inner peripheral surface.

The cylindrical portion 21 may be formed in a truncated cone shape. The cylindrical portion 21 may extend downwardly so as to spread outwardly from the outer peripheral edge of the disk portion 20 as shown in FIG. 2. Also, the cylindrical portion 21 may become smaller in thickness in proportion to an approach to a lower end of the cylindrical portion 21 as shown in FIG. 2.

The upper spin shaft 18 is disposed rotatably around a rotational axis A2 (an axis that coincides with the rotational axis A1 of the substrate W) that passes through the center of the shielding plate 17 and that extends vertically. The upper spin shaft 18 is circularly cylindrical. An inner peripheral surface of the upper spin shaft 18 is formed at a cylindrical plane that centers on the rotational axis A2. An internal space of the upper spin shaft 18 communicates with the through hole 20b of the shielding plate 17. The upper spin shaft 18 is relatively rotatably supported by a support arm 22 that horizontally extends above the shielding plate 17.

In the present preferred embodiment, the upper-surface nozzle 19 functions as a center shaft nozzle. The upper-surface nozzle 19 is disposed above the spin chuck 5. The upper-surface nozzle 19 is supported by the support arm 22. The upper-surface nozzle 19 is unrotatable with respect to the support arm 22. The upper-surface nozzle 19 moves up and down together with the shielding plate 17, the upper spin shaft 18, and the support arm 22. The upper-surface nozzle 19 has its lower end in which a discharge port 19a that faces a central part of the upper surface of the substrate W held by the spin chuck 5 is formed.

A shielding-plate rotation unit 26 configured to include an electric motor and the like is joined to the shielding plate 17. The shielding-plate rotation unit 26 rotates the shielding plate 17 and the upper spin shaft 18 around the rotational axis A2 with respect to the support arm 22. A shielding-member lifting unit 27 configured to include an electric motor, a ball screw, etc., is joined to the support arm 22. The shielding-member lifting unit 27 raises and lowers the shielding member 6 (the shielding plate 17 and the upper spin shaft 18) and the upper-surface nozzle 19 together with the support arm 22 in a vertical direction.

The shielding-member lifting unit 27 raises and lowers the shielding plate 17 between a shielding position at which the substrate-facing surface 20a approaches the upper surface of the substrate W held by the spin chuck 5 and at which the height of the lower end of the cylindrical portion 21 is placed below the height of the substrate W (shown by the alternate long and two short dashed line in FIG. 2. See also FIG. 7A and the like) and a retreat position that retreats greatly more upwardly than the shielding position (shown by the solid line in FIG. 2). The shielding-member lifting unit 27 is capable of holding the shielding plate 17 at the shielding position, at a nearby position (shown by the broken line in FIG. 2), and at the retreat position. The shielding position is a position at which the substrate-facing surface 20a forms a shielding space 28 (see FIG. 7B and the like) between the upper surface of the substrate W and the substrate-facing surface 20a. Although the shielding space 28 is not completely isolated from its circumambient space, a gas does not flow into the shielding space 28 from the circumambient space. In other words, the shielding space 28 is substantially shielded from its circumambient space. The nearby position is placed slightly above the retreat position. In a state in which the shielding plate 17 is placed at the nearby position, a space between the substrate-facing surface 20a of the shielding plate 17 and the substrate W is not shielded from the circumambient space.

The sublimation-agent supply unit includes the upper-surface nozzle 19 and a sublimation agent unit 31 that supplies a liquid sublimation agent to the upper-surface nozzle 19. The sublimation agent unit 31 includes a sublimation agent pipe 32 connected to the upper-surface nozzle 19 and a sublimation agent valve 33 interposed in the sublimation agent pipe 32. The sublimation agent supplied to the sublimation agent pipe 32 is a solvent that has a sublimation capability and whose freezing point is low, and a solvent such as a fluorine-based organic solvent having a ring structure (whose freezing point is about 20.5° C.) or tertiary butyl alcohol (whose freezing point is about 25° C.) can be mentioned as an example. The sublimation agent supplied to the sublimation agent pipe 32 is a liquid sublimation agent whose temperature is slightly higher than the freezing point. In a case in which a fluorine-based organic solvent having a ring structure is employed as a sublimation agent, a sublimation agent having a room temperature (about 23° C. to about 25° C.) is given to the sublimation agent pipe 32. In a case in which tertiary butyl alcohol is employed as a sublimation agent, a sublimation agent that has undergone temperature control so as to have a temperature of about 30° C. is given to the sublimation agent pipe 32. A liquid sublimation agent is supplied to the upper-surface nozzle 19 by opening the sublimation agent valve 33, and, as a result, the liquid sublimation agent is discharged downwardly from the discharge port 19a. The use of a fluorine-based organic solvent having a ring structure as a sublimation agent also makes it possible to disuse a temperature control unit for high vapor-pressure liquids, and it is possible to use the sublimation agent at a room temperature, and therefore it is possible to reduce costs.

An acid chemical-liquid supply unit 34, an alkaline chemical-liquid supply unit 35, a rinse-liquid supply unit 36, an organic-solvent supply unit 37, and a gas supply unit 38 are connected to the upper-surface nozzle 19.

The acid chemical-liquid supply unit 34 includes an acid chemical-liquid pipe 41 connected to the upper-surface nozzle 19 and an acid chemical-liquid valve 42 interposed in the acid chemical-liquid pipe 41. A chemical liquid including at least one of a group consisting of, for example, hydrofluoric acid (HF), hydrochloric acid, sulfuric acid, phosphoric acid, and nitric acid can be mentioned as an acid chemical liquid given to the acid chemical-liquid pipe 41. In the present preferred embodiment, hydrofluoric acid (HF) is employed as an acid chemical liquid. An acid chemical liquid is supplied to the upper-surface nozzle 19 by opening the acid chemical-liquid valve 42, and, as a result, the acid chemical liquid is discharged downwardly from the discharge port 19a.

The alkaline chemical-liquid supply unit 35 includes an alkaline chemical-liquid pipe 43 connected to the upper-surface nozzle 19 and an alkaline chemical-liquid valve 44 interposed in the alkaline chemical-liquid pipe 43. A chemical liquid including at least one of a group consisting of, for example, ammonia and hydroxyl can be mentioned as an alkaline chemical liquid given to the alkaline chemical-liquid pipe 43. In the present preferred embodiment, SC1 (a liquid that includes $NH_4OH$ and $H_2O_2$) is employed as an alkaline chemical liquid. An alkaline chemical liquid is supplied to the upper-surface nozzle 19 by opening the alkaline chemical-liquid valve 44, and, as a result, the alkaline chemical liquid is discharged downwardly from the discharge port 19a.

The rinse-liquid supply unit 36 includes a rinse liquid pipe 45 connected to the upper-surface nozzle 19 and a rinse liquid valve 46 interposed in the rinse liquid pipe 45. A rinse liquid given to the rinse liquid pipe 45 is, for example, deionized water (DIW), and yet, without being limited to DIW, the rinse liquid may be anyone of carbonated water, electrolyzed ion water, hydrogen water, ozone water, and hydrochloric acid water having a diluted concentration (for example, about 10 ppm to 100 ppm). A rinse liquid is supplied to the upper-surface nozzle 19 by opening the rinse liquid valve 46, and, as a result, the rinse liquid is discharged downwardly from the discharge port 19a.

The high vapor-pressure liquid unit 37 and the upper-surface nozzle 19 make up a high vapor-pressure liquid supply unit. The high vapor-pressure liquid unit 37 includes a high vapor-pressure liquid pipe 53 connected to the upper-surface nozzle 19 and a high vapor-pressure liquid valve 48 interposed in the high vapor-pressure liquid pipe 53. A high vapor-pressure liquid given to the high vapor-pressure liquid pipe 53 is a liquid that has vapor pressure higher than water (vapor pressure higher than the sublimation agent) (i.e., whose boiling point is lower than water) and that does not include water. This high vapor-pressure liquid has specific gravity smaller than a fluorine-based organic solvent (specific gravity of 1.05 $g/cm^3$) having a ring structure included in the sublimation-agent-liquid-film.

The high vapor-pressure liquid is, for example a solvent, more specifically IPA (isopropyl alcohol, specific gravity 0.78 $g/cm^3$). For example, methanol, ethanol, acetone, and HFE (hydrofluoroether) can be mentioned as the organic solvent, besides IPA. Also, a liquid mixed with other components may be used as the organic solvent without being limited to a monocomponent liquid. The organic solvent may be, for example, a mixed liquid of IPA and acetone, or may be, for example, a mixed liquid of IPA and methanol.

The temperature of the high vapor-pressure liquid supplied to the high vapor-pressure liquid pipe 53 is several degrees (° C.) higher than the freezing point of the sublimation agent (solvent) supplied to the sublimation-agent pipe 32. In a case in which a fluorine-based organic solvent having a ring structure is employed as a sublimation agent supplied to the sublimation agent pipe 32, the high vapor-pressure liquid has a room temperature, and is given to the lower-surface supply pipe 52. In a case in which tertiary butyl alcohol is employed as a sublimation agent, the high vapor-pressure liquid has a temperature of about 30° C., and is given to the lower-surface supply pipe 52. IPA is used as a high vapor-pressure liquid in the present preferred embodiment, and therefore the high vapor-pressure liquid unit 37 functions also as a unit that supplies an organic solvent that is a low-surface-tension liquid whose specific gravity is larger than air and whose surface tension is lower than water.

The gas supply unit 38 includes a gas supply pipe 49 connected to the upper-surface nozzle 19 and a gas valve 50 that opens and closes the gas supply pipe 49. The gas given to the gas supply pipe 49 is a dehumidified gas, particularly, a dehumidified inert gas. The inert gas includes, for example, a nitrogen gas and an argon gas. The gas is supplied to the upper-surface nozzle 19 by opening the gas valve 50, and, as a result, the gas is discharged downwardly from the discharge port 19a.

The processing cup 8 is disposed at a more outward position than the substrate W held by the spin chuck 5 (in a direction away from the rotational axis A1). The processing cup 8 includes a plurality of cups 61 to 63 (first to third cups 61 to 63) surrounding the circumference of the spin base 14, a plurality of guards 64 to 66 (inner guard 64, intermediate guard 65, outer guard 66) each of which receives processing liquids (chemical liquid, rinse liquid, organic solvent, hydrophobizing agent, and the like) that have scattered around the substrate W, and a guard lifting unit 67 (see FIG. 5) that individually raises and lowers the plurality of guards 64 to 66. The processing cup 8 is disposed outside the outer periphery of the substrate W held by the spin chuck 5 (in the direction away from the rotational axis A1).

Each cup 61 to 63 is circularly cylindrical, and surrounds the periphery of the spin chuck 5. The second cup 62 that is the second from the inside is disposed outside the first cup 61, and the outermost third cup 63 is disposed outside the second cup 62. The third cup 63 is, for example, integrally united with the intermediate guard 65, and is raised and lowered together with the intermediate guard 65. Each cup 61 to 63 forms an annular groove that is upwardly opened.

A drainage pipe 76 is connected to the groove of the first cup 61. A processing liquid guided to the groove of the first cup 61 is sent to waste-liquid equipment placed outside the apparatus through the drainage pipe 76.

A collection pipe 77 is connected to the groove of the second cup 62. A processing liquid (chiefly, chemical liquid) guided to the groove of the second cup 62 is sent to the collection equipment placed outside the apparatus through the collection pipe 77, and is collected and processed in the collection equipment.

A collection pipe 78 is connected to the groove of the third cup 63. A processing liquid (for example, organic solvent) guided to the groove of the third cup 63 is sent to the collection equipment placed outside the apparatus through the collection pipe 78, and is collected and processed in the collection equipment.

Each guard 64 to 66 is circularly cylindrical, and surrounds the periphery of the spin chuck 5. Each guard 64 to 66 includes a cylindrical guide portion 68 that surrounds the periphery of the spin chuck 5 and a cylindrical inclined portion 69 that extends obliquely upwardly toward the center side from an upper end of the guide portion 68 (in a direction approaching the rotational axis A1 of the substrate W). An upper end part of each inclined portion 69 defines an inner peripheral part of each guard 64 to 66, and has a diameter greater than the substrate Wand the spin base 14. The three inclined portions 69 are piled together upwardly and downwardly, and the three guide portions 68 are disposed coaxially. The three guide portions 68 (guide portions 68 of the guards 64 to 66) are capable of coming into or out of the corresponding cups 61 to 63, respectively. In other words, the processing cup 8 is collapsible, and is folded and unfolded by allowing the guard lifting unit 67 to raise and lower at least one of the three guards 64 to 66. In the inclined portion 69, its sectional shape may be linear as shown in FIG. 2, or may extend, for example, smoothly while making a convex circular arc.

Each guard 64 to 66 is raised and lowered between an upper position (where the upper end part of each inclined portion 69 is placed above the upper surface of the substrate W) and a lower position (where the upper end part of each inclined portion 69 is placed below the upper surface of the substrate W) by driving the guard lifting unit 67.

In a state in which any one of the guards 64 to 66 faces a peripheral end surface of the substrate W, a processing liquid (acid chemical liquid, alkaline chemical liquid, rinse liquid, organic solvent, sublimation agent, high vapor-pressure liquid, etc.) is supplied to the substrate W, or the substrate W is dried. In order to realize a state in which, for example, the outermost outer guard 66 faces the peripheral end surface of the substrate W (state of FIG. 7D, which is hereinafter referred to as the "third guard facing state" when necessary), the inner guard 64 and the intermediate guard 65 are placed at the lower position, and the outer guard 66 is placed at the upper position. In the third guard facing state, all of the processing liquid discharged from the peripheral edge of the substrate W being in a rotational state is received by the outer guard 66.

In order to realize a state in which the intermediate guard 65, which is the second from the inside, faces the peripheral end surface of the substrate W (state of FIG. 7A, etc., which is hereinafter referred to as the "second guard facing state" when necessary), the inner guard 64 is placed at the lower position, and the intermediate guard 65 and the outer guard 66 are placed at the upper position. In the second guard facing state, all of the processing liquid discharged from the peripheral edge of the substrate W being in a rotational state is received by the intermediate guard 65.

In order to realize a state in which the innermost inner guard 64 faces the peripheral end surface of the substrate W (not shown, which is hereinafter referred to as the "first guard facing state" when necessary), all of the three guards 64 to 66 are placed at the upper position. In the first guard facing state, all of the processing liquid discharged from the peripheral edge of the substrate W being in a rotational state is received by the inner guard 64.

For example, in a state in which any one of the three guards 64 to 66 faces the peripheral end surface of the substrate W, a HF step S3 (see FIG. 5), a rinse step S4 (see FIG. 5), an SC1 step S5 (see FIG. 5), a rinse step S6 (see FIG. 5), a replacing step S7 (see FIG. 5), and a sublimation drying step S8 (see FIG. 5), which are described later, are performed. Therefore, a processing liquid that has scattered around the substrate W when a processing liquid is being supplied to the substrate W is guided to any one of the cups 61 to 63 by means of any one of the inner guard 64, the intermediate guard 65, and the outer guard 66.

Figure 3:
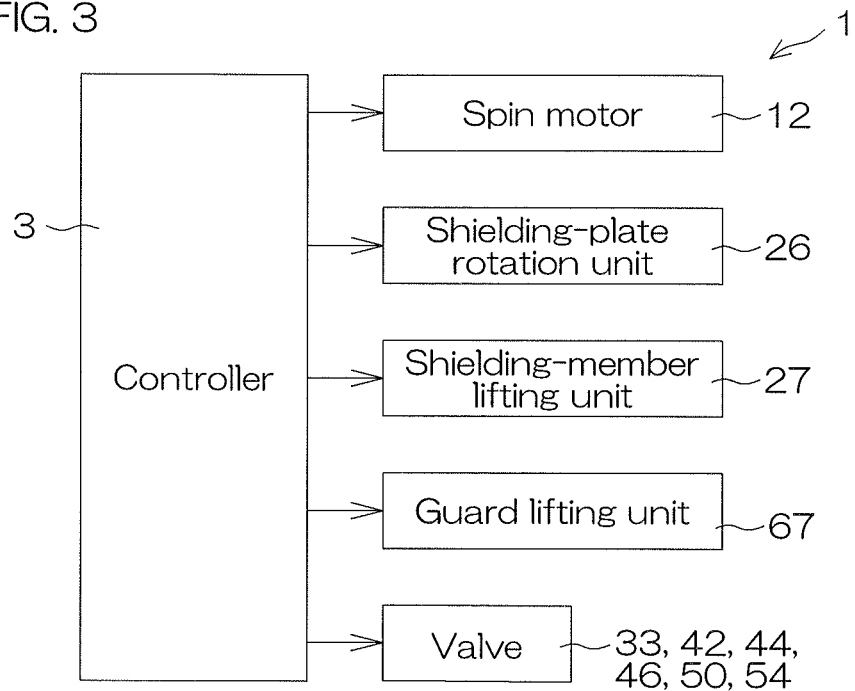
FIG. 3 is a block diagram shown to describe an electrical configuration of a main part of the substrate processing apparatus.

FIG. 3 is a block diagram shown to describe an electrical configuration of a main part of the substrate processing apparatus 1.

The controller 3 is formed by use of, for example, a microcomputer. The controller 3 has an arithmetic unit, such as CPU, a storage unit, such as a read-only memory device and a hard disk drive, and an input-output unit. A program executed by the arithmetic unit is stored in the storage unit.

The spin motor 12, the shielding-member lifting unit 27, the shielding-plate rotation unit 26, the guard lifting unit 67, etc., which are to be controlled, are connected to the controller 3. The controller 3 controls the operations of the spin motor 12, the shielding-member lifting unit 27, the shielding-plate rotation unit 26, the guard lifting unit 67, etc., in accordance with a predetermined program.

Also, the controller 3 opens and closes the sublimation agent valve 33, the acid chemical-liquid valve 42, the alkaline chemical-liquid valve 44, the rinse liquid valve 46, the organic solvent valve 48, the gas valve 50, and the high vapor-pressure liquid valve 54 in accordance with a predetermined program.

A description will be hereinafter given of a case in which a substrate W having its front surface Wa that is a device-forming surface and on which a pattern 100 is formed is processed.

Figure 4:
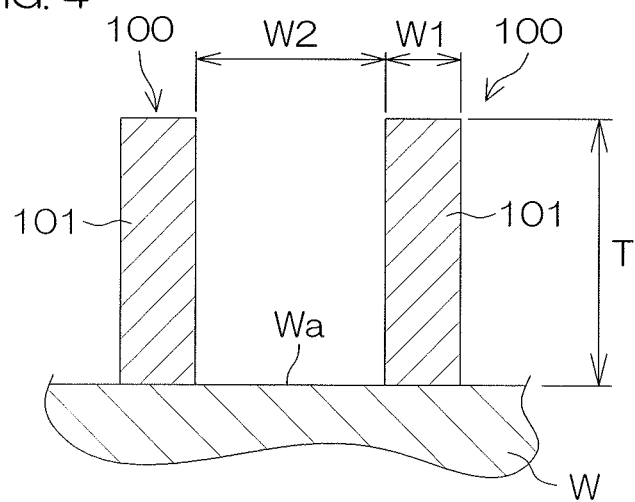
FIG. 4 is an enlarged cross-sectional view of a front surface of a substrate that is to be processed by the substrate processing apparatus.

FIG. 4 is an enlarged cross-sectional view of a front surface Wa of a substrate W that is to be processed by the substrate processing apparatus 1. The substrate W to be processed is, for example, a silicon wafer. A pattern 100 is formed on the front surface Wa that is a pattern forming surface. The pattern 100 is, for example, a microscopic pattern. The pattern 100 may be a pattern in which structural elements 101 each of which has a convex shape (pillar shape) are disposed in a matrix manner as shown in FIG. 4. In this case, the pattern 100 is formed such that a line width W1 of the structural element 101 is, for example, about 3 nm to 45 nm and such that a gap W2 of the pattern 100 is, for example, about 10 nm to several μm, respectively. A film thickness T of the pattern 100 is, for example, about 0.2 μm to 1.0 μm. Also, the pattern 100 may be formed such that, for example, an aspect ratio (ratio of the film thickness T with respect to the line width W1) is, for example, about 5 to 500 (typically, it is about 5 to 50).

Also, the pattern 100 may be formed such that a linear pattern formed by a microscopic trench is repeatedly arranged. Also, the pattern 100 may be formed such that a plurality of microscopic holes (voids or pores) are made in a thin film.

The pattern 100 includes, for example, an insulating film. The pattern 100 may also include a conductor film. More specifically, the pattern 100 may be formed with a laminated film in which a plurality of films are stacked together, and may include an insulating film and a conductor film. The pattern 100 may be a pattern made of a single layer film. The insulating film may be a silicon oxide film ($SiO_2$ film) or may be a silicon nitride film (SiN film). Also, the conductor film may be an amorphous silicon film doped with impurities for low resistivity, or may be a metal film (for example, TiN film).

Also, the pattern 100 may be a hydrophilic film. A TEOS film (kind of silicon oxide film) can be mentioned as an example of the hydrophilic film.

Figure 5:
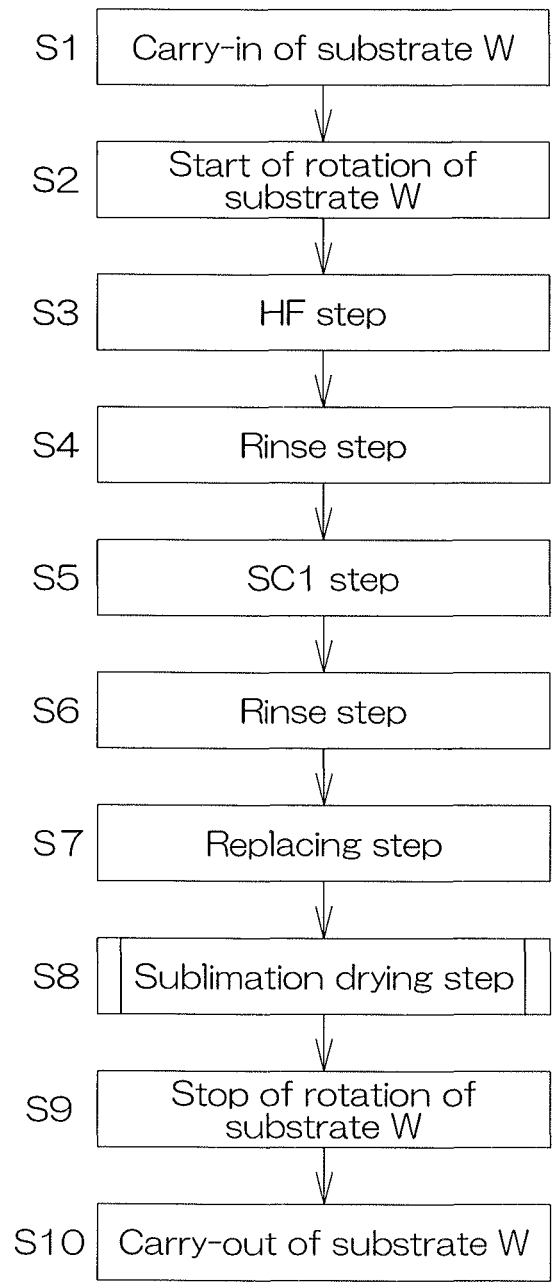
FIG. 5 is a flowchart shown to describe the contents of a first substrate processing example performed in the processing unit.

FIG. 5 is a flowchart shown to describe the contents of a first substrate processing example performed in the processing unit 2. The first substrate processing example will be described with reference to FIG. 1 to FIG. 5.

An unprocessed substrate W (for example, a circular substrate having a diameter of 300 mm) is carried into the processing unit 2 from the substrate container C by means of the indexer robot IR and the substrate transfer robot CR, is then carried into the chamber 4, is then delivered to the spin chuck 5 in a state in which the front surface Wa (see FIG. 4 and the like) of the substrate W is directed upwardly, and is held by the spin chuck 5 (S1 of FIG. 5: Carry-in of Substrate W). In this state, the rear surface Wb of the substrate W (see FIG. 7A and the like) is directed downwardly. The substrate W is carried into the chamber 4 in a state in which the shielding plate 17 has been retreated to the retreat position and in a state in which the guards 64 to 66 have been placed at the lower position.

After the substrate transfer robot CR is retreated outwardly from the processing unit 2, the controller 3 increases the rotation speed of the spin base 14 to a predetermined liquid treatment speed (within the range of about 10 to 1200 rpm, e.g., about 300 rpm) while controlling the spin motor 12, and maintains the liquid treatment speed (S2 of FIG. 5: Start of rotation of Substrate W).

Furthermore, the controller 3 lowers the shielding plate 17 from the retreat position, and places it at the nearby position while controlling the shielding-member lifting unit 27.

Furthermore, the controller 3 allows the inner guard 64 to face the peripheral end surface of the substrate W (i.e., realizes the first guard facing state) by raising the inner guard 64, the intermediate guard 65, and the outer guard 66 to the upper position while controlling the guard lifting unit 67.

When the rotation of the substrate W reaches the liquid treatment speed, the controller 3 then performs the HF step S3 (see FIG. 5) in which HF, which is an example of an acid chemical liquid, is supplied to the front surface Wa of the substrate W. In detail, the controller 3 opens the acid chemical-liquid valve 42. As a result, HF is discharged from the discharge port 19a of the upper-surface nozzle 19 toward the central part of the front surface Wa of the substrate W being in a rotational state. HF supplied to the front surface Wa of the substrate W moves to the peripheral edge of the substrate W while receiving a centrifugal force generated by the rotation of the substrate W. Consequently, the whole area of the front surface Wa of the substrate W is processed by use of HF.

HF that has moved to the peripheral edge of the substrate W is discharged from the peripheral edge of the substrate W in a lateral direction of the substrate W. HF discharged from the peripheral edge of the substrate W is received by an inner wall of the inner guard 64, is then allowed to flow down along the inner wall of the inner guard 64, and is sent to waste liquid treatment equipment placed outside the apparatus through the first cup 61 and through the drainage pipe 76.

When a predetermined period of time elapses from the start of discharge of HF, the controller 3 closes the acid chemical-liquid valve 42, and stops the discharge of HF from the upper-surface nozzle 19. Consequently, the HF step S3 is ended.

Thereafter, the controller 3 performs the rinse step S4 (see FIG. 5) in which a chemical liquid is excluded from on the substrate W by replacing HF present on the substrate W with a rinse liquid. In detail, the controller 3 opens the rinse liquid valve 46 while maintaining the first guard facing state of the processing cup 8. As a result, the rinse liquid is discharged from the discharge port 19a of the upper-surface nozzle 19 toward the central part of the front surface Wa of the substrate W being in a rotational state. The rinse liquid supplied to the front surface Wa of the substrate W moves to the peripheral edge of the substrate W while receiving a centrifugal force generated by the rotation of the substrate W. Consequently, HF adhering to the surface of the substrate W is rinsed away by the rinse liquid.

The rinse liquid discharged from the peripheral edge of the substrate W is discharged from the peripheral edge of the substrate W in the lateral direction of the substrate W. The rinse liquid discharged from the peripheral edge of the substrate W is received by the inner wall of the inner guard 64, is then allowed to flow down along the inner wall of the inner guard 64, and is sent to the waste liquid treatment equipment placed outside the apparatus through the first cup 61 and through the drainage pipe 76. When a predetermined period of time elapses from the open of the rinse liquid valve 46, the controller 3 closes the rinse liquid valve 46. Consequently, the rinse step S4 is ended.

Thereafter, the controller 3 performs the SC1 step S5 (see FIG. 5) in which SC1 that is an example of an alkaline chemical liquid is supplied to the front surface Wa of the substrate W. In detail, the controller 3 opens the alkaline chemical-liquid valve 44. As a result, SC1 is discharged from the discharge port 19a of the upper-surface nozzle 19 toward the central part of the front surface Wa of the substrate W being in a rotational state. SC1 supplied to the front surface Wa of the substrate W moves to the peripheral edge of the substrate W while receiving a centrifugal force generated by the rotation of the substrate W. Consequently, the whole area of the front surface Wa of the substrate W is processed by use of SC1.

SC1 that has moved to the peripheral edge of the substrate W is discharged from the peripheral edge of the substrate W in the lateral direction of the substrate W. SC1 discharged from the peripheral edge of the substrate W is received by the inner wall of the inner guard 64, is then allowed to flow down along the inner wall of the inner guard 64, and is sent to the waste liquid treatment equipment placed outside the apparatus through the first cup 61 and through the drainage pipe 76.

When a predetermined period of time elapses from the start of discharge of SC1, the controller 3 closes the alkaline chemical-liquid valve 44, and stops the discharge of SC1 from the upper-surface nozzle 19. Consequently, the SC1 step S5 is ended.

Thereafter, the controller 3 performs the rinse step S6 (see FIG. 5) in which a chemical liquid is excluded from on the substrate W by replacing SC1 present on the substrate W with a rinse liquid. In detail, the controller 3 opens the rinse liquid valve 46 while maintaining the first guard facing state of the processing cup 8. As a result, the rinse liquid is discharged from the discharge port 19a of the upper-surface nozzle 19 toward the central part of the front surface Wa of the substrate W being in a rotational state. The rinse liquid supplied to the front surface Wa of the substrate W moves to the peripheral edge of the substrate W while receiving a centrifugal force generated by the rotation of the substrate W. Consequently, SC1 adhering to the surface of the substrate W is rinsed away by the rinse liquid.

The rinse liquid discharged from the peripheral edge of the substrate W is discharged from the peripheral edge of the substrate W in the lateral direction of the substrate W. The rinse liquid discharged from the peripheral edge of the substrate W is received by the inner wall of the inner guard 64, is then allowed to flow down along the inner wall of the inner guard 64, and is sent to the waste liquid treatment equipment placed outside the apparatus through the first cup 61 and through the drainage pipe 76. When a predetermined period of time elapses from the open of the rinse liquid valve 46, the controller 3 closes the rinse liquid valve 46. Consequently, the rinse step S6 is ended.

Thereafter, the controller 3 performs the replacing step S7 (see FIG. 5). The replacing step S7 is a step in which a rinse liquid on the substrate W is replaced by an organic solvent (in this example, IPA) that is lower in surface tension than the rinse liquid (water). The controller 3 allows the outer guard 66 to face the peripheral end surface of the substrate W (i.e., realizes the third guard facing state) by lowering the inner guard 64 and the intermediate guard 65 to the lower position while controlling the guard lifting unit 67.

Furthermore, the controller 3 opens the organic solvent valve 48. As a result, IPA is discharged from the discharge port 19*a* of the upper-surface nozzle 19 toward the central part of the front surface Wa of the substrate W being in a rotational state. IPA supplied to the front surface Wa of the substrate W receives a centrifugal force generated by the rotation of the substrate W, and spreads over the whole area of the front surface Wa of the substrate W. Consequently, in the whole area of the front surface Wa of the substrate W, the rinse liquid adhering to the front surface Wa is replaced by an organic solvent. The organic solvent that moves on the front surface Wa of the substrate W is discharged from the peripheral edge of the substrate W in the lateral direction of the substrate W. The organic solvent discharged from the peripheral edge of the substrate W is received by the inner wall of the outer guard 66, is then allowed to flow down along the inner wall of the outer guard 66, and is sent to the collection equipment through the third cup 63 and the collection pipe 78.

When a predetermined period of time elapses from the open of the organic solvent valve 48, the controller 3 closes the organic solvent valve 48. Consequently, the replacing step S7 is ended.

Furthermore, after the end of the replacing step S7, the controller 3 performs the sublimation drying step S8 (see FIG. 5). In the sublimation drying step S8, a liquid sublimation agent is supplied to the front surface Wa of the substrate W, and a liquid film that is thick enough to soak the pattern 100 is formed on the front surface Wa of the substrate W, and then a sublimation agent film is formed by solidifying the liquid film. Thereafter, a sublimation agent included in the sublimation agent film is sublimated by rotating the substrate W at a high speed. In this case, a liquid phase does not exist between the patterns 100 of the front surface Wa of the substrate W when the substrate W is rotated at a high speed, and therefore it is possible to dry the substrate W while lessening the problem of the pattern collapse. The sublimation drying step S8 will be described in detail as follows.

When a predetermined period of time elapses from the start of the high-speed rotation in the sublimation drying step S8, the controller 3 stops the rotation of the spin chuck 5 while controlling the spin motor 12 (S9 of FIG. 5: Stop of Rotation of Substrate W). Furthermore, the controller 3 lowers the outer guard 66 while controlling the guard lifting unit 67, and allows all guards to retreat downwardly from the peripheral end surface of the substrate W.

Thereafter, the substrate transfer robot CR enters the processing unit 2, and carries an already-processed substrate W out of the processing unit 2 (S10 of FIG. 5: Carry-out of Substrate W). The substrate W carried out therefrom is delivered to the indexer robot IR from the substrate transfer robot CR, and is stored in the substrate container C by means of the indexer robot IR.

Figure 6:
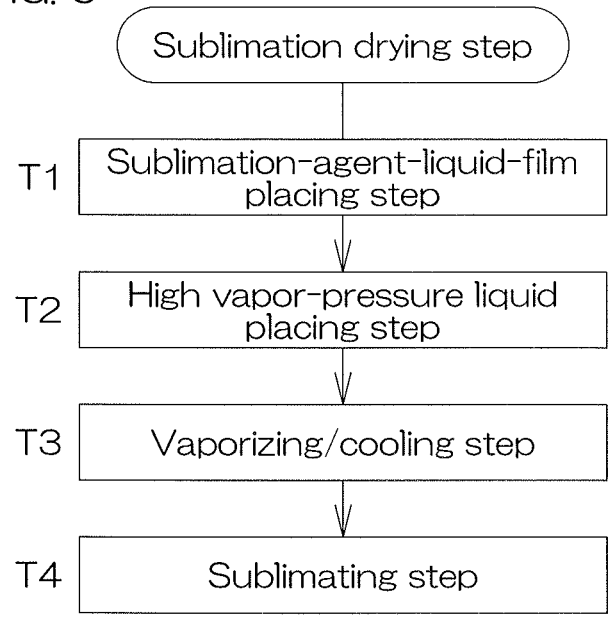
FIG. 6 is a flowchart shown to describe a sublimation drying step of FIG. 5.

FIG. 6 is a flowchart shown to describe the sublimation drying step S8 of FIG. 5. FIG. 7A to FIG. 7F are schematic views, each showing a state around the substrate W when the sublimation drying step S8 is performed.

The sublimation drying step S8 includes a sublimation-agent-liquid-film placing step T1 in which a liquid film 81 of a liquid sublimation agent (i.e., a sublimation-agent-liquid-film 81) is placed on the front surface Wa of the substrate W, a high vapor-pressure liquid placing step T2 in which a liquid film 86 of a high vapor-pressure liquid (i.e., a high vapor-pressure liquid film 86) that has vapor pressure higher than water (vapor pressure higher than a sublimation agent) and that does not include water is placed above the sublimation-agent-liquid-film 81, and a vaporizing/cooling step T3 in which vaporization heat is lost in response to the vaporization of a high vapor-pressure liquid after the high vapor-pressure liquid film 86 is placed there, and, as a result, the sublimation-agent-liquid-film 81 is cooled. The sublimation agent included in the sublimation-agent-liquid-film 81 is solidified by performing the vaporizing/cooling step T3, and a solid sublimation-agent film 82 is formed on the front surface Wa of the substrate W. The sublimation drying step S8 also includes a sublimating step T4 that sublimates the sublimation-agent film 82.

The sublimation-agent-liquid-film placing step T1 includes a sublimation-agent supply step (see FIG. 7A) in which a sublimation agent is supplied to the front surface Wa of the substrate W and a thinning step (see FIG. 7B) in which the sublimation agent supplied thereto is thinly spread (is thinned) on the front surface Wa of the substrate W by rotating the substrate W around the rotational axis A1 without supplying a sublimation agent.

Figure 7A:
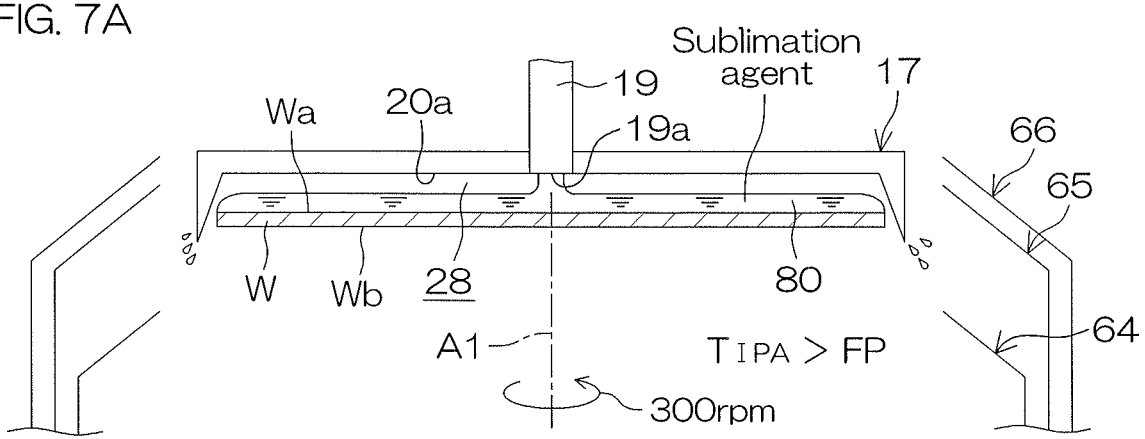
FIG. 7A to FIG. 7F are schematic views, each showing a state around the substrate when the sublimation drying step is performed.
Figure 7B:
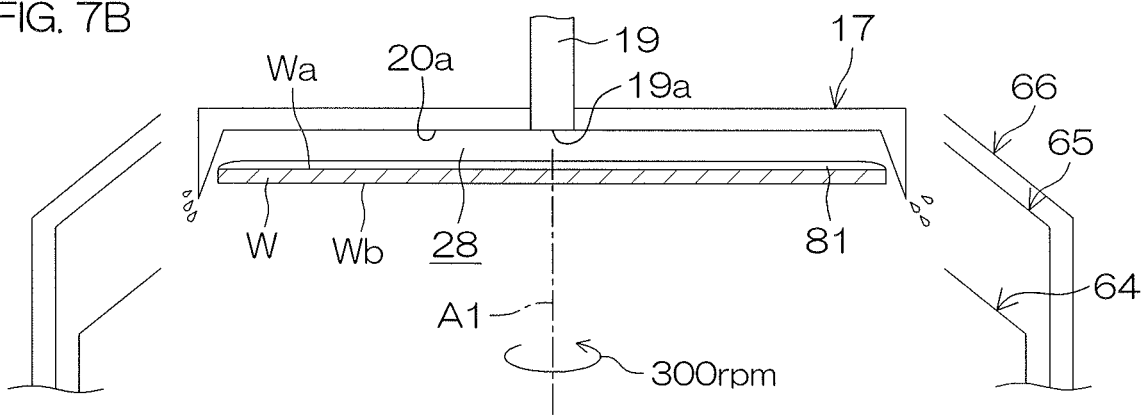
Figure 7C:
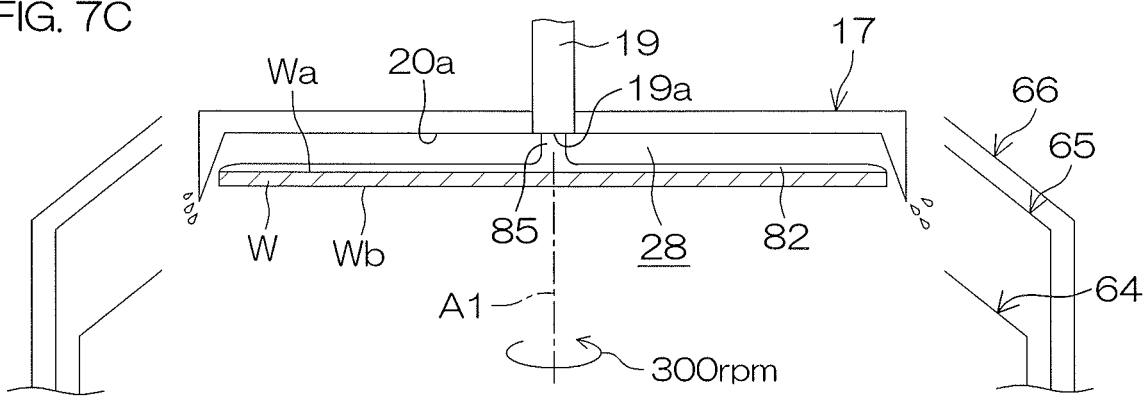
Figure 7D:
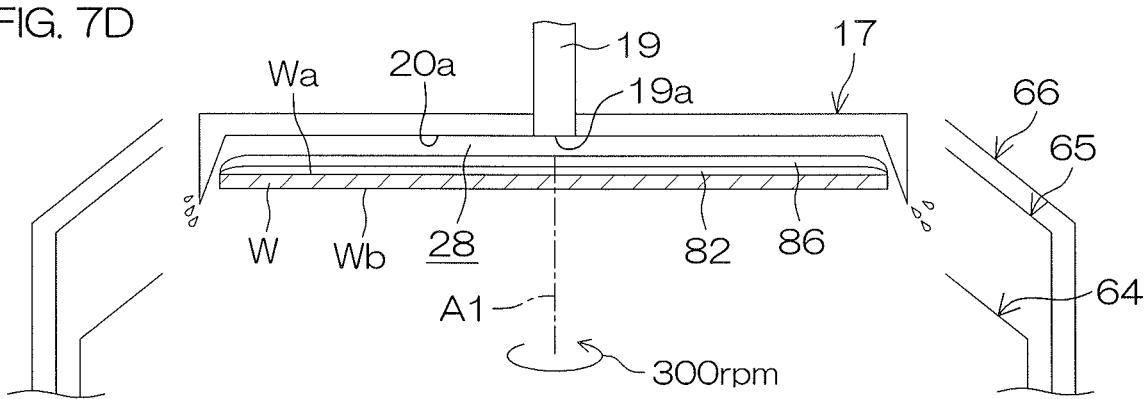

The high vapor-pressure liquid placing step T2 includes a high vapor-pressure liquid supply step in which a continuously-flowing high vapor-pressure liquid is supplied onto the sublimation-agent-liquid-film 81 (see FIG. 7C) and a surface-layer forming step in which a surface layer of the sublimation-agent-liquid-film 81 is formed according to a difference in specific gravity between the high vapor-pressure liquid supplied thereto and the sublimation agent because the specific gravity of the high vapor-pressure liquid is smaller than the specific gravity of the sublimation agent (see FIG. 7D).

In the sublimation drying step S8, there is a fear that the sublimation of the sublimation agent will be obstructed if water is mixed with the sublimation-agent film 82 that has been solidified. Not only that, there is another fear that the pattern collapse will be promoted by the fact that water is liquefied in the surface of the substrate W. Therefore, the sublimation drying step S8 is required to be performed in a state in which moisture has been excluded from the front surface Wa of the substrate W as much as possible so that water does not mix with the sublimation-agent-liquid-film 81 or does not mix with the sublimation-agent-film 82 that has been solidified (i.e., while maintaining the front surface Wa of the substrate W at a low humidity). Therefore, the sublimation drying step S8 is performed in the shielding space 28 (see FIG. 7A and the like).

When the sublimation drying step S8 (sublimation-agent supply step T1) is started, the controller 3 lowers the shielding plate 17 from the nearby position to the shielding position while controlling the shielding-member lifting unit 27. Consequently, the shielding space 28 is formed between the substrate-facing surface 20*a* and the front surface Wa of the substrate W. Furthermore, the controller 3 lowers the inner guard 64 to the lower position while controlling the guard lifting unit 67, and, as a result, allows the intermediate guard 65 to face the peripheral end surface of the substrate W (i.e., realizes a second guard facing state).

And, the controller 3 performs the sublimation-agent supply step T1. In detail, the controller 3 opens the sublimation agent valve 33 while keeping the rotation of the substrate W at the liquid treatment speed. As a result, a liquid sublimation agent is discharged from the discharge port 19*a* of the upper-surface nozzle 19 toward the central part of the front surface Wa of the substrate W being in a rotational state. The sublimation agent supplied to the front surface Wa of the substrate W receives a centrifugal force generated by the rotation of the substrate W, and moves to the peripheral edge of the substrate W. Consequently, a sublimation-agent-liquid-film 80 with which the whole area of the front surface Wa of the substrate W is covered is formed as shown in FIG. 7A.

Thereafter, the controller 3 performs the thinning step T2. The substrate W is rotated at a liquid treatment speed (about 300 rpm) while closing the sublimation agent valve 33 (i.e., in a state of stopping the supply of the sublimation agent from the upper-surface nozzle 19). In the thinning step T2, it is possible to spread the sublimation agent by a centrifugal force generated by the rotation of the substrate W on the front surface Wa of the substrate W. The thickness of the sublimation-agent-liquid-film 81 that has been thinned is, for example, about 10 μm. Consequently, it is possible to excellently form the sublimation-agent-liquid-film 81 that has an appropriate and small thickness on the front surface Wa of the substrate W, and it is possible to equalize the thickness of the sublimation-agent-liquid-film 81 in the plane of the substrate W.

Thereafter, the controller 3 performs the high vapor-pressure liquid placing step T2. In detail, the controller 3 opens the high vapor-pressure liquid valve 54 while keeping the rotation of the substrate W at the liquid treatment speed in the sublimation-agent supply step (see FIG. 7C). As a result, a continuously-flowing high vapor-pressure liquid is supplied from the discharge port 19a of the upper-surface nozzle 19 toward the central part of the sublimation-agent-liquid-film 81 as shown in FIG. 7C. The high vapor-pressure liquid supplied to the front surface Wa of the substrate W receives a centrifugal force generated by the rotation of the substrate W, and moves to the peripheral edge of the substrate W on the sublimation-agent-liquid-film 81. This high vapor-pressure liquid has a liquid temperature ($T_{IPA}$) that is several degrees (° C.) higher than the freezing point (FP) of the sublimation agent supplied to the front surface Wa of the substrate W ($T_{IPA}$>FP). Therefore, the sublimation-agent-liquid-film 81 on the front surface Wa of the substrate W is not immediately cooled to or below the freezing point of the sublimation-agent by the supply of the high vapor-pressure liquid to the substrate W. When a predetermined period of time elapses from the opening of the high vapor-pressure liquid valve 54, the controller 3 closes the high vapor-pressure liquid valve 54.

The continuously-flowing high vapor-pressure liquid is supplied on the sublimation-agent-liquid-film 81, and, as a result, the sublimation agent and the high vapor-pressure liquid temporarily mix with each other, and, with the lapse of time, a layer of the high vapor-pressure liquid is floated (separated) to a surface of the sublimation-agent-liquid-film 81 because of a difference in specific gravity between the high vapor-pressure liquid supplied there and the sublimation agent. Consequently, a high vapor-pressure liquid film 86 that serves as a surface layer of the sublimation-agent-liquid-film 81 is formed. In other words, the high vapor-pressure liquid film 86 is placed on the sublimation-agent-liquid-film 81 (surface-layer forming step (see FIG. 7D)).

Figure 7E:
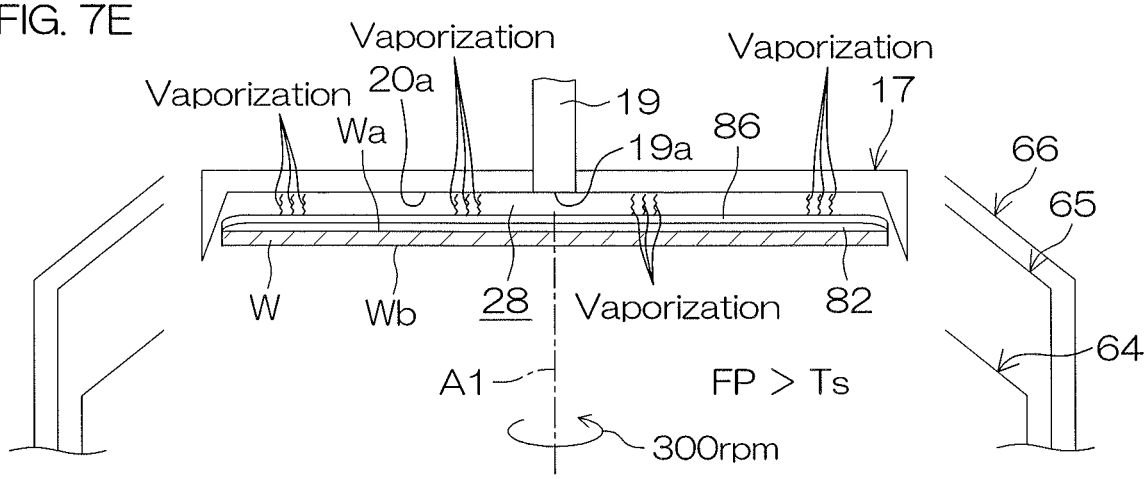

Thereafter, the controller 3 performs the vaporizing/cooling step T3 (see FIG. 7E). The substrate W continues to rotate at the liquid treatment speed during the vaporizing/cooling step T3.

After the supply of the high vapor-pressure liquid is stopped (i.e., after the high vapor-pressure liquid film 86 is placed there), the vaporization of the high vapor-pressure liquid having high vapor pressure is advanced in the upper surface of the sublimation-agent-liquid-film 81. Vaporization heat is lost from the sublimation-agent-liquid-film 81 in response to the vaporization of the high vapor-pressure liquid in the upper surface of the sublimation-agent-liquid-film 81. Consequently, the sublimation-agent-liquid-film 81 is also cooled. In response to the cooling, the sublimation agent included in the sublimation-agent-liquid-film 81 is reduced in temperature to or below the freezing point (FP) of the sublimation agent (more specifically, lower in temperature than the freezing point (FP)). Consequently, the sublimation agent included in the sublimation-agent-liquid-film 81 is solidified. A solid sublimation-agent film 82 is formed on the front surface Wa of the substrate W by the fact that all of the sublimation agent included in the sublimation-agent-liquid-film 81 is solidified. The temperature Ts of the sublimation-agent film 82 is lower than the freezing point (FP>Ts).

When a predetermined period of time elapses from the closing of the high vapor-pressure liquid valve 54, the vaporizing/cooling step T3 is ended.

Figure 7F:
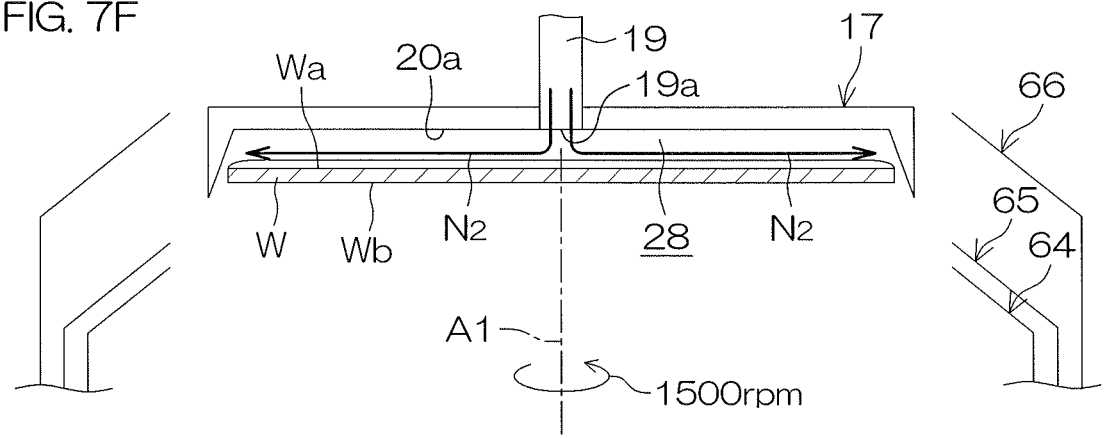

Thereafter, the controller 3 performs the sublimating step T4 (see FIG. 7F). The controller 3 lowers the intermediate guard 65 to the lower position while controlling the guard lifting unit 67, and, as a result, allows the outer guard 66 to face the peripheral end surface of the substrate W (i.e., realizes the third guard facing state). Furthermore, the controller 3 accelerates the rotation of the substrate W to a high speed (e.g., about 1500 rpm) (rotational speed higher than in the sublimation-agent-liquid-film placing step T10 and in the vaporizing/cooling step T3). Furthermore, the controller 3 allows the shielding plate 17 to rotate at a speed equal to that of the rotation of the substrate W and in the same direction as the rotation of the substrate W while controlling the shielding-plate rotation unit 26. The contact speed between the sublimation-agent film 82 and its circumambient atmosphere is increased in response to the high-speed rotation of the substrate W. Whereby, it is possible to advance the sublimation of the sublimation-agent film 82, and hence makes it possible to sublimate the sublimation-agent film in a short time.

Furthermore, the controller 3 opens the gas valve 50 in the sublimating step T4. As a result, a dehumidified gas is discharged from the discharge port 19a of the upper-surface nozzle 19 toward the central part of the front surface Wa of the substrate W being in a rotational state. Whereby, it is possible to perform the sublimating step T4 while keeping the shielding space 28 in a low humidity state.

In the sublimating step T4, sublimating heat is lost in response to the sublimation of the sublimation-agent film 82, and the sublimation-agent film 82 is kept at or below the freezing point (melting point). Therefore, it is possible to prevent the sublimation agent included in the sublimation-agent film 82 from being melted. Whereby, it is possible to excellently realize sublimation drying.

As described above, according to the present preferred embodiment, a sublimation-agent-liquid-film 81 is placed on the front surface Wa of the substrate W. Also, a high vapor-pressure liquid film 86 that has vapor pressure higher than water (vapor pressure higher than a sublimation agent) and that does not include water is placed above the sublimation-agent-liquid-film 81 (on the side opposite to the substrate W). After the high vapor-pressure liquid film 86 is placed (i.e., after the supply of the high vapor-pressure liquid is stopped), vaporization heat is lost in response to the vaporization of the high vapor-pressure liquid, and, as a result, the sublimation-agent-liquid-film 81 is cooled, and the sublimation agent liquid included in the sublimation-agent-liquid-film 81 is solidified. Whereby, it is possible to excellently form the sublimation-agent film 82 while preventing contamination of water into the solid sublimation-agent film 82.

In the sublimating step T4, sublimating heat is lost in response to the sublimation of the sublimation-agent film 82, and the sublimation-agent film 82 is kept at or below the freezing point (melting point). Therefore, it is possible to prevent the sublimation agent included in the sublimation-agent film 82 from being melted. Possible to excellently realize sublimation drying.

By the way, if a neglected state without care continues after the discharge of a sublimation agent from the upper-surface nozzle 19 is ended, there is a fear that a sublimation agent adhering to the discharge port 19a of the upper-surface nozzle 19 will vaporize, and, accordingly, a pipe wall near the discharge port 19a of the upper-surface nozzle 19 will be cooled. If a sublimation agent remains inside the discharge port 19a of the upper-surface nozzle 19 as shown in FIG. 8A, there is a fear that a sublimation agent existing near the discharge port 19a of the upper-surface nozzle 19 will be solidified thereafter as shown in FIG. 8B.

However, in the high vapor-pressure liquid placing step T2 that is performed subsequently to the sublimation-agent-liquid-film placing step T1, a high vapor-pressure liquid is discharged from the same upper-surface nozzle 19, and, as a result, the liquid inside the upper-surface nozzle 19 is replaced with the high vapor-pressure liquid from the sublimation agent as shown in FIG. 8C. In the vaporizing/cooling step T3, the high vapor-pressure liquid exists inside the upper-surface nozzle 19. A high vapor-pressure liquid existing near the discharge port 19a of the upper-surface nozzle 19 is not solidified by cooling the pipe wall near the discharge port 19a of the upper-surface nozzle 19. Consequently, a unit that prevents a sublimation agent from being solidified is not required to be provided near the discharge port 19a of the upper-surface nozzle 19. Whereby, it is possible to reduce costs.

Also, although the sublimation-agent-liquid-film placing step T1 includes the sublimation-agent supply step (see FIG. 7A) and the thinning step (see FIG. 7B) as described above, the thinning step (see FIG. 7B) may be excluded.

Second Preferred Embodiment

FIG. 9 is a schematic view showing a state around a substrate W when the sublimation drying step S8 is performed in a second preferred embodiment of the present invention.

In the second preferred embodiment, the same reference sign as in FIGS. 1 to 8C is given to an element equivalent to each element mentioned in the first preferred embodiment, and a description of the element is omitted.

A point in which a processing unit 201 according to the second preferred embodiment differs from the processing unit 2 according to the first preferred embodiment is that the processing unit 201 includes a lower-surface nozzle 202 facing the central part of the rear surface Wb of the substrate W.

The lower-surface nozzle 202 has a single discharge port 202a facing the central part of the lower surface of the substrate W held by the spin chuck 5. The discharge port 202a discharges a liquid vertically upwardly. A liquid discharged thereby substantially perpendicularly strikes the central part of the lower surface of the substrate W held by the spin chuck 5. A second high vapor-pressure liquid pipe 203 is connected to the lower-surface nozzle 202. A second high vapor-pressure liquid valve 204 is interposed in the second high vapor-pressure liquid pipe 203. A second high vapor-pressure liquid given to the second high vapor-pressure liquid pipe 203 is a liquid that has vapor pressure higher than water (vapor pressure higher than a sublimation agent) (i.e., whose boiling point is lower than water (sublimation agent)) and that does not include water. The high vapor-pressure liquid is, for example, a solvent, and in particular, IPA (isopropyl alcohol). For example, methanol, ethanol, acetone, and HFE (hydrofluoroether) can be mentioned as such a second high vapor-pressure liquid (solvent), besides IPA. Also, a liquid mixed with other components may be used as the second high vapor-pressure liquid without being limited to a monocomponent liquid. The liquid may be, for example, a mixed liquid of IPA and acetone, or may be, for example, a mixed liquid of IPA and methanol. The liquid may be identical in liquid kind with the high vapor-pressure liquid supplied to the front surface of the substrate W as in the present preferred embodiment, or may be different in liquid kind therefrom.

When the second high vapor-pressure liquid valve 204 is opened, a high vapor-pressure liquid is vertically upwardly discharged from the discharge port 202a. When the second high vapor-pressure liquid valve 204 is closed in this state, the discharge of the high vapor-pressure liquid from the discharge port 202a is stopped.

In the present preferred embodiment, the controller 3 supplies a second high vapor-pressure liquid to the rear surface Wb of the substrate W, and then stops the supply of the second high vapor-pressure liquid before the vaporizing/cooling step T3.

According to the second preferred embodiment, a second high vapor-pressure liquid is supplied to the rear surface Wb of the substrate W. Vaporization heat is lost in response to the vaporization of the second high vapor-pressure liquid by stopping the supply of the second high vapor-pressure liquid. In other words, vaporization heat is lost from the sublimation agent by means of the high vapor-pressure liquid on the front-surface-Wa side of the substrate W, and, not only that, vaporization heat is also lost from the sublimation agent by means of the second high vapor-pressure liquid on the rear-surface-Wb side of the substrate W, thus making it possible to cool the sublimation-agent-liquid-film 81 in a short time.

Third Preferred Embodiment

Figure 11:
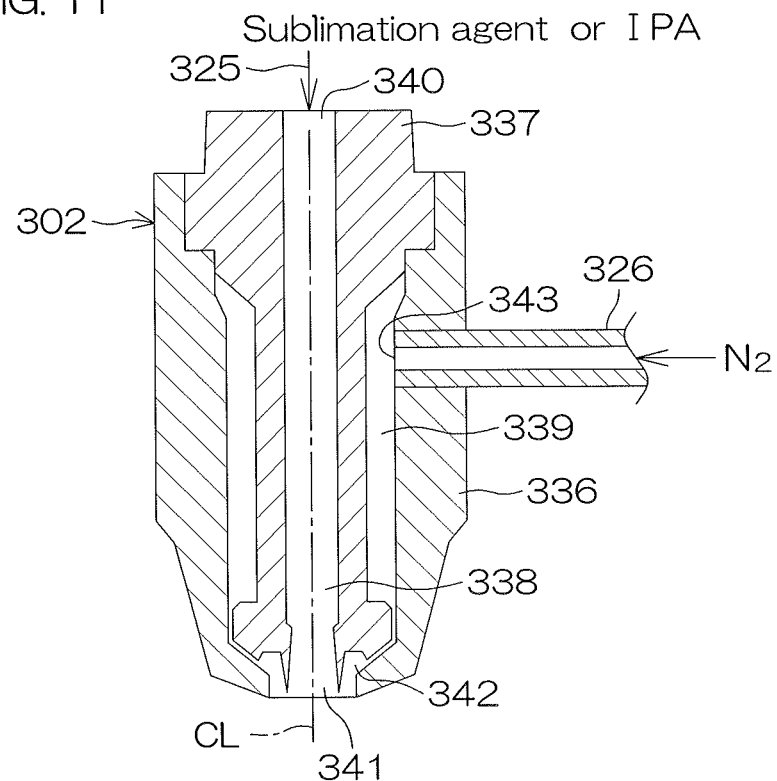
FIG. 11 is a cross-sectional view that pictorially shows a configuration of a spray nozzle of FIG. 10.

FIG. 10 is a schematic view showing a state around a substrate W when the sublimation drying step S8 is performed in a third preferred embodiment of the present invention. FIG. 11 is a cross-sectional view that pictorially shows a configuration of a spray nozzle 302 of FIG. 10.

In the third preferred embodiment, the same reference sign as in FIGS. 1 to 8C is given to an element equivalent to each element mentioned in the first preferred embodiment, and a description of the element is omitted.

A point in which a processing unit 301 according to the third preferred embodiment differs from the processing unit 2 according to the first preferred embodiment is that a sublimation-agent and a high vapor-pressure liquid are discharged to the front surface Wa of the substrate W not by means of the upper-surface nozzle 19 passing through the blocking plate 17 upwardly and downwardly but by means of a spray nozzle (spray unit) 302 that sprays liquid droplets of a processing liquid.

The spray nozzle 302 has a form of a multi-fluid nozzle (in more detail, two-fluid nozzle) that jets fine liquid droplets of a processing liquid. A fluid supply unit that supplies a processing liquid and a gas to the spray nozzle 302 is connected to the spray nozzle 302.

As shown in FIG. 11, the spray nozzle 302 has a substantially-cylindrical external shape. The spray nozzle 302 includes an outer cylinder 336 forming a casing and an inner cylinder 337 fitted into the outer cylinder 336.

The outer cylinder 336 and the inner cylinder 337 are coaxially disposed on a central axis CL shared therebetween, and are connected to each other. The internal space of the inner cylinder 337 serves as a linear processing-liquid flow passage 338 through which a processing liquid from a processing-liquid pipe 325 flows. Also, a cylindrical gas flow passage 339 through which a gas supplied from a gas pipe 326 flows is formed between the outer cylinder 336 and the inner cylinder 337.

The processing-liquid flow passage 338 is opened as a processing-liquid inlet 340 at an upper end of the inner cylinder 337. A processing liquid from the processing-liquid pipe 325 is introduced into the processing-liquid flow passage 338 through the processing-liquid inlet 340. Also, the processing-liquid flow passage 338 is opened as a circular processing-liquid discharge port 341 that has its center on the central axis CL at a lower end of the inner cylinder 337. The processing liquid introduced into the processing-liquid flow passage 338 is discharged from the processing-liquid discharge port 341.

The gas flow passage 339 is a cylindrical space that has its central axis that is used also as the central axis CL, and is closed at upper end parts of the outer and inner cylinders 336 and 337, and is opened as an annular gas discharge port 342 that has its center on the central axis CL and that surrounds the processing-liquid discharge port 341 at the lower ends of the outer and inner cylinders 336 and 337. A lower end part of the gas flow passage 339 has a flow passage area smaller than an intermediate part in the length direction of the gas flow passage 339, and downwardly becomes smaller in diameter. Also, a gas inlet 343 that communicates with the gas flow passage 339 is formed in an intermediate part of the outer cylinder 336.

The gas pipe 326 is connected to the gas inlet 343 in a state of passing through the outer cylinder 336, and the internal space of the gas pipe 326 and the gas flow passage 339 are allowed to communicate with each other. A gas from the gas pipe 326 is introduced into the gas flow passage 339 through the gas inlet 343, and is discharged from the gas discharge port 342.

It is possible to generate fine liquid droplets of a processing liquid, and is possible to discharge the processing liquid in anatomized state by discharging the processing liquid from the processing-liquid discharge port 341 while discharging a gas from the gas discharge port 342 and by allowing the gas to strike the processing liquid (i.e., to mix with the processing liquid) near the spray nozzle 302. In the present preferred embodiment, the processing-liquid discharge port 341 and the gas discharge port 342 make up a spray portion that sprays liquid droplets of a processing liquid.

When a sublimation agent is supplied to the front surface Wa of the substrate W, it is desirable for a continuously-flowing sublimation agent to be supplied. Therefore, the controller 3 allows a sublimation agent to be supplied to the processing-liquid pipe 325, and does not allow a gas to be supplied from the gas pipe 326. Consequently, a continuously-flowing sublimation agent is discharged from the spray nozzle 302 toward the front surface Wa of the substrate W.

On the other hand, when a high vapor-pressure liquid is supplied to the front surface Wa of the substrate W, it is desirable for liquid droplets of a high vapor-pressure liquid to be supplied so that the liquid droplets thereof can be supplied widely and evenly. Therefore, the controller 3 allows a high vapor-pressure liquid to be supplied to the processing-liquid pipe 325, and allows a gas to be supplied to the gas pipe 326. Consequently, liquid droplets of a high vapor-pressure liquid are discharged from the spray nozzle 302 toward a sublimation-agent-liquid-film 81 on the front surface Wa of the substrate W (high vapor-pressure liquid spray step).

According to the present preferred embodiment, liquid droplets of a high vapor-pressure liquid are sprayed onto the front surface Wa of the substrate W, and therefore it is possible to supply a high vapor-pressure liquid onto the sublimation-agent-liquid-film 81 widely and evenly. Whereby, it is possible to excellently place a liquid film of a high vapor-pressure liquid on the sublimation-agent-liquid-film 81.

Although the three preferred embodiments of the present invention have been described as examples as above, the present invention can also be embodied in other modes.

Figure 12:
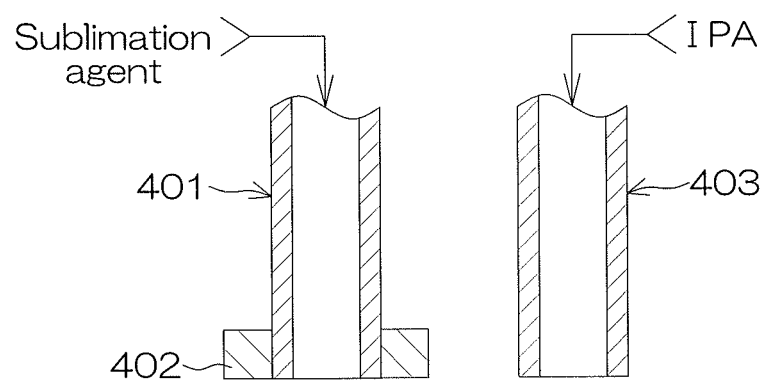
FIG. 12 shows a modification of the present invention.

Although the discharge of a sublimation agent in the sublimation-agent-liquid-film placing step T1 and the discharge of a high vapor-pressure liquid in the high vapor-pressure liquid placing step T2 are performed by the shared nozzle as described in each of the aforementioned preferred embodiments, the respective discharges of liquids in the aforementioned steps may be performed by use of mutually different nozzles, respectively. In other words, a sublimation agent is discharged from a sublimation-agent-nozzle 401 in the sublimation-agent-liquid-film placing step T1 as shown in FIG. 12. A high vapor-pressure liquid is discharged from a high vapor-pressure liquid nozzle 403 in the high vapor-pressure liquid placing step T2. In this case, a heater 402 (sublimation-agent-nozzle heating unit) is disposed at a forward end part of the sublimation-agent-nozzle 401. The heater 402 is, for example, a resistance-type heater. The sublimation agent-nozzle 401 is heated by this heater after a sublimation agent is supplied from the sublimation-agent-nozzle 401 (sublimation-agent-nozzle heating step). Whereby, it is possible to prevent a sublimation agent from being solidified at the forward end part of the sublimation-agent-nozzle 401. An inner-outer dual piping structure, besides the heater 402, may be employed as the sublimation-agent-nozzle heating unit, and a sublimation agent that exists in an inner pipe may be heated by a temperature-controlling liquid that flows through an outer pipe.

Also, although the substrate processing apparatus 1 is an apparatus that processes a substrate W of a semiconductor wafer as described in the aforementioned preferred embodiment, the substrate processing apparatus may be an apparatus that processes substrates, such as substrates for liquid crystal displays, substrates for FPDs (Flat Panel Displays) such as organic EL (electroluminescence) displays, substrates for optical disks, substrates for magnetic disks, substrates for magneto-optical disks, substrates for photomasks, ceramic substrates, and substrates for solar cells.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

This application corresponds to Japanese Patent Application No. 2017-167867 filed in the Japan Patent Office on Aug. 31, 2017, and the entire disclosure of the application is incorporated herein by reference.

What is claimed is:

1. A substrate drying method for drying a front surface of a substrate having a pattern, the substrate drying method comprising:
   a sublimation-agent-liquid-film placing step of placing a liquid film of a sublimation agent in a liquid state thereof on the front surface of the substrate, the sublimation agent contained in the liquid film of the sublimation agent having a temperature higher than a freezing point of the sublimation agent;
   a high vapor-pressure liquid placing step of placing a liquid film of a high vapor-pressure liquid that has vapor pressure higher than that of the sublimation agent in the liquid state and that does not include water on the liquid film of the sublimation agent placed on the front surface of the substrate, the high vapor-pressure liquid contained in the liquid film of the high vapor-pressure liquid having a temperature higher than the freezing point of the sublimation agent;
   a vaporizing/cooling step of losing vaporization heat in response to vaporization of the high vapor-pressure liquid, and, cooling the sublimation agent in the liquid state thereof from the temperature higher than the freezing point thereof to the freezing point or a temperature lower than the freezing point so as to change the sublimation agent in the liquid state to the sublimation agent in a solid state thereof, thereby solidifying the liquid film of the sublimation agent, and, forming a sublimation-agent film of the sublimation agent in the solid state on the front surface of the substrate; and
   a sublimating step of sublimating the sublimation-agent film.

2. The substrate drying method according to claim 1, wherein the high vapor-pressure liquid included in the liquid film of the high vapor-pressure liquid has specific gravity smaller than that of the sublimation agent, and
   the high vapor-pressure liquid placing step includes a continuously-flowing supply step of supplying the high vapor-pressure liquid in a continuously-flowing state from above toward the liquid film of the sublimation agent placed on the front surface of the substrate, and the liquid film of the high vapor-pressure liquid is formed by a difference in specific gravity with respect to the sublimation agent.

3. The substrate drying method according to claim 1, wherein the high vapor-pressure liquid placing step includes a high vapor-pressure liquid spray step of spraying liquid droplets of the high vapor-pressure liquid from above toward the liquid film of the sublimation agent placed on the front surface of the substrate.

4. The substrate drying method according to claim 1, wherein the high vapor-pressure liquid placing step includes a step of supplying the high vapor-pressure liquid from a nozzle that is used also as a nozzle that supplies the sublimation agent in the liquid state in the sublimation-agent-liquid-film placing step.

5. The substrate drying method according to claim 1, wherein the high vapor-pressure liquid placing step includes a step of supplying the high vapor-pressure liquid from a high vapor-pressure liquid nozzle different from a sublimation-agent nozzle that supplies a sublimation agent in the liquid state in the sublimation-agent-liquid-film placing step,
   the substrate drying method further comprising a sublimation-agent-nozzle heating step of heating the sublimation-agent nozzle after the sublimation agent in the liquid state is supplied from the sublimation-agent nozzle.

6. The substrate drying method according to claim 1, further comprising a step of, prior to the vaporizing/cooling step, supplying a second high vapor-pressure liquid that has vapor pressure higher than that of the sublimation agent to a rear surface that is a surface on a side opposite to the front surface of the substrate, and then stopping supplying the second high vapor-pressure liquid.

7. The substrate drying method according to claim 1, further comprising:
   a substrate rotating step of rotating the substrate around a predetermined rotational axis in parallel in time with at least one of the sublimation-agent-liquid-film placing step and the vaporizing/cooling step; and
   a high-speed rotation step of rotating the substrate around the predetermined rotational axis at a speed higher than a substrate rotation speed in the substrate rotating step in parallel in time with the sublimating step.

* * * * *